(12) United States Patent
Ghoshal

(10) Patent No.: US 12,342,721 B2
(45) Date of Patent: Jun. 24, 2025

(54) DOUBLE-SIDED THERMOELECTRIC DEVICES WITH INSULATORS

(71) Applicant: Sheetak, Inc., Austin, TX (US)

(72) Inventor: Uttam Ghoshal, Austin, TX (US)

(73) Assignee: Sheetak, Inc., Austin, TX (US)

( * ) Notice: Subject to any disclaimer, the term of this patent is extended or adjusted under 35 U.S.C. 154(b) by 0 days.

(21) Appl. No.: 18/395,409

(22) Filed: Dec. 22, 2023

(65) Prior Publication Data

US 2024/0389460 A1    Nov. 21, 2024

Related U.S. Application Data

(63) Continuation of application No. 17/769,742, filed as application No. PCT/US2020/056345 on Oct. 19, 2020, now Pat. No. 11,856,857.

(60) Provisional application No. 63/030,167, filed on May 26, 2020, provisional application No. 63/020,528, filed on May 5, 2020, provisional application No. 62/951,808, filed on Dec. 20, 2019, provisional application No. 62/916,663, filed on Oct. 17, 2019.

(51) Int. Cl.
| | | |
|---|---|---|
| *H10N 10/17* | (2023.01) | |
| *H10N 10/01* | (2023.01) | |
| *H10N 10/852* | (2023.01) | |
| *H10N 10/853* | (2023.01) | |

(52) U.S. Cl.
CPC ............. *H10N 10/17* (2023.02); *H10N 10/01* (2023.02); *H10N 10/852* (2023.02); *H10N 10/853* (2023.02)

(58) Field of Classification Search
CPC .... H10N 10/17; H10N 10/852; H10N 10/853; H10N 10/01
See application file for complete search history.

(56) References Cited

U.S. PATENT DOCUMENTS

2011/0000517 A1*  1/2011  Park .................. H10N 10/17
                                                  136/200

* cited by examiner

*Primary Examiner* — Tae-Sik Kang
(74) *Attorney, Agent, or Firm* — Clark Hill PLC

(57) ABSTRACT

The disclosure is related to structures and method of making thermoelectric devices. The structures include an electrically and thermally nonconductive substrate with cylindrical or frustum-shaped tunnels. The tunnels may be filled with thermally and electrically conductive materials that resist diffusion. The structures include n-type and p-type materials, in homogeneous form or alternating with interlayers to block phonon conduction between layers of thermoelectric materials. The tunnels are individually associated with either n-type or p-type thermoelectric materials and connected in pairs to form alternating conductors on both sides of the substrate. The structures may also be coated with layers of gold and nickel and have thermoelectric materials deposited in the tunnels. The tunnels may be partially or fully capped with sintered nano-silver or solder. Notches may alternate sides to electrically isolate each side of the structure to provide current flow between the p-type and n-type thermoelectric layers.

14 Claims, 35 Drawing Sheets

DOUBLE-SIDED THERMOELECTRIC DEVICES WITH INSULATORS

BACKGROUND OF THE DISCLOSURE

1. Field of the Disclosure

The present disclosure relates to apparatuses and methods for making thermoelectric devices, and, in particular, increasing coefficients of performance in thermoelectric devices and efficiencies for heating, cooling, and power generation.

2. Description of the Related Art

Thermoelectric devices have been used since the 1900s to heat, cool, and generate power; however, widespread use has been held back due to poor performance and low efficiency when compared with other available heating, cooling, and power generation technologies. Key factors in understanding the performance of thermoelectric devices include the coefficient of performance (COP), which is the ratio of the thermal output power and the electrical input power of a thermoelectric device, the temperature differential across the hot and cold sides of the thermoelectric device, and the efficiency and reliability of the thermoelectric device.

A shortcoming in prior art thermoelectric devices is backflow of heat which result in low COP and efficiency. Another shortcoming is low reliability due to heat-related expansion and contraction of the thermoelements and adjacent structures with dissimilar coefficients of thermal expansion, including the need for solder between layers, which can result in failures. Another shortcoming is the interdiffusion of thermoelectric materials, solders, and metals for interconnections. Another shortcoming is the difficulty in assembly and manufacture of thermoelectric devices.

What are needed are thermoelectric device structures that reduce thermal losses, do not rely on soldered connections, resist diffusion of thermoelements into substrate materials, and increase performance.

BRIEF SUMMARY OF THE DISCLOSURE

In aspects, the present disclosure is related to an apparatus and method for making thermoelectric devices, and, in particular, increasing coefficients of performance in thermoelectric devices and efficiencies for heating, cooling, and power generation.

One embodiment according to the present disclosure includes a thermoelectric apparatus, the apparatus including: a thermally and electrically non-conductive substrate having a first side and second side; a plurality of tunnels between the first side and the second side, where each of the tunnels has a first opening on the first side and a second opening on the second side, and where the first opening is larger than the second opening; wherein within each tunnel is deposited: a via body; a bottom layer disposed on the via body proximate to the first side; a base barrier layer disposed on the via body proximate to the second side; an energy filter layer adjacent to the second side and the plurality of base layers; a plurality of thermoelectric layers disposed adjacent to the energy filter layer for each of the plurality of base layers, wherein each of the thermoelectric layers comprises alternating composite thermoelectric layers and interlayers; and wherein the thermoelectric layers for each tunnel are either n-type or p-type; a plurality of top layers disposed on each of the plurality of thermoelectric layers; a first plurality of conductive links proximate to the first side and electrically connected between pairs tunnels associated with n-type and p-type thermoelectric layers; and a second plurality of conductive links proximate to the second side and electrically connected between pairs of tunnels associate with n-type and p-type thermoelectric layers and alternating with the first plurality of conductive links. The energy filter layer may be made of two-dimensional electron gas (2DEG) structures, twisted layers of graphene, layers of hexagonal boron nitride (HBN) and graphene, silicene, phosphene, or SiTe. The base barrier layer may be made of one or more of: rhodium, platinum, iridium, tantalum/tantalum nitride, titanium/titanium nitride, chromium, or cobalt. The base barrier layer may be made of multiple sublayers. At least one of the sublayers may be made of a thermoelectric material with $\sigma S^2 > 0.001$ $Wm^{-1}K^{-2}$, where $\sigma$ is electrical conductivity and S is Seebeck, coefficient. The n-type thermoelectric layer may be made of one or more of: Bi—Te—Se, SiGe—P, $Mg_3Bi_2$, Mg—Sb—B—Te, InSb, BiSb, PbSe, SnSSe, Half-Heusler alloys, full Heusler alloys, Fe—V—W—Al, Yb—Ba—Co—Sb, La—Te, Pr—Te, SiGe—C, and YbAl; and the p-type thermoelectric layer is made of one or more of: BiSb—Te, SiGe—B, Zintl compounds, Yb—Mn—Sb, Ce—Fe—Co—Sb, CePd, CsBiTe, PbTe, and ZnSb. The plurality of top layers may be made of platinum. The plurality of top layers may each include multiple layers, including a first sub top layer made of one of: platinum, cobalt, nickel, TiW, titanium, iridium, and rhodium; a second sub top layer made of one of: platinum, cobalt, and nickel; and a third sub top layer made of one of: platinum and gold; wherein the first sub top layer is adjacent to one of the thermoelectric layers and wherein the second sub top layer is disposed between the first sub top layer and the third sub top layer. The apparatus of claim 1, where the via body and the thermally and electrically non-conductive substrates have coefficients of thermal expansion of about 7 ppm/° C.

Another embodiment according to the present disclosure includes a thermoelectric apparatus, the apparatus including: a thermally and electrically non-conductive substrate having a first side and second side; a plurality of tunnels between the first side and the second side, where each of the tunnels has a first opening on the first side and a second opening on the second side, and where the first opening is larger than the second opening; wherein within each tunnel is deposited: a via body; a bottom layer disposed on the via body proximate to the first side; a base barrier layer disposed on the via body proximate to the second side; an adhesion layer adjacent to the second side and the plurality of base layers; an energy filter layer adjacent to the adhesion layer; a plurality of thermoelectric layers disposed adjacent to the energy filter layer for each of the plurality of base layers, wherein each of the thermoelectric layers comprises alternating composite thermoelectric layers and interlayers; and wherein the thermoelectric layers for each tunnel are either n-type or p-type; a plurality of top layers disposed on each of the plurality of thermoelectric layers; a first plurality of conductive links proximate to the first side and electrically connected between pairs tunnels associated with n-type and p-type thermoelectric layers; and a second plurality of conductive links proximate to the second side and electrically connected between pairs of tunnels associate with n-type and p-type thermoelectric layers and alternating with the first plurality of conductive links. The adhesion layer may include one or more of: titanium, chromium, zirconium, and hafnium. The adhesion layer may be about 5 nanometers to about 30 nanometers in thickness.

Another embodiment according to the present disclosure includes a thermoelectric apparatus including a thermoelement base made of a thermally and electrically non-conductive substrate having a first surface and a second surface; a tunnel between the first surface and the second surface, where the tunnel has a first opening in the first surface and a second opening in the second surface; a first gold layer proximate to the second surface; a nickel layer adjacent to the first gold layer; and a second gold layer adjacent to the nickel layer; a barrier layer disposed within the tunnel proximate to the first surface; a thermoelectric layer disposed within the tunnel adjacent to the barrier layer, wherein the thermoelectric layer conforms to the shape of the barrier layer, the tunnel, and the second surface; a metal layer disposed within the tunnel adjacent to the thermoelectric layer, wherein the thermoelectric layer conforms to the shape of the barrier layer, the tunnel, and the second surface; and a cap layer disposed within the tunnel adjacent to the metal layer and proximate to the second surface. The substrate may be made of one of: a polyimide, a liquid crystal polymer (LCPs), parylene, PTFE, polymer aerogels, and a glass. The substrate is between about 10 micrometers to about 1000 micrometers thick; the first gold layer is about first gold layer is about 400 nanometers thick; the nickel layer is about 5 micrometers thick; and the second gold layer is about 1 micrometer thick. The thermoelectric layer is made of a thermoelectric material that is either an n-type thermoelectric material or a p-type thermoelectric material. The n-type thermoelectric material is made of one or more of: Bi—Te—Se, SiGe—P, $Mg_3Bi_2$, Mg—Sb—Bi—Te, InSb, BiSb, PbSe, SnSSe, Half-Heusler alloys, full Heusler alloys, Fe—V—W—Al, Yb—Ba—Co—Sb, La—Te, Pr—Te, SiGe—C, and YbAl. The p-type thermoelectric material is made of one or more of: BiSb—Te, SiGe—B, Zintl compounds, Yb—Mn—Sb, Ce—Fe—Co—Sb, CePd, CsBiTe, PbTe, and ZnSb. The thermoelectric layer may further be made up of layers of an interlayer that alternate with the n-type thermoelectric material or the p-type thermoelectric material. The interlayer may be made of one of TiW, gold, iridium, platinum, tungsten, molybdenum, and InSb. The barrier is about 5 micrometers thick. The barrier layer may be made of one or more of: rhodium, platinum, iridium, tantalum/tantalum nitride, titanium/titanium nitride, chromium, and cobalt. The metal layer may be made of platinum or a plurality of sublayers. The sublayer may include a first sublayer made of one of: platinum, nickel, TiW, Ta—TaN, titanium, cobalt, iridium, and rhodium; a second sublayer made of one of: platinum, cobalt, and nickel; and a third sublayer made of one of: platinum, gold, and silver, wherein the first sublayer is disposed adjacent to the thermoelectric layer and the second sublayer is disposed between the first sublayer and the third sublayer. The cap layer may be made of one of: sintered nano-silver and solder. In some embodiments, there may be an adhesion layer disposed between the first surface of the substrate and the first gold layer. In some embodiments, there may be an energy filter layer disposed between the barrier layer and the thermoelectric layer. The energy filter layer may be made of 2D materials such as graphene or layers of twisted graphene.

Another embodiment according to the present disclosure includes a method for manufacturing a thermoelement, the method may include the steps of: preparing a first surface and a second surface of a substrate; adding a first gold layer proximate to the second surface of the substrate; adding a nickel layer to the first gold layer opposite the substrate; adding a second gold layer to the nickel layer opposite the first gold layer; ablating the first surface for form a tunnel through the substrate and down to the first gold layer; depositing a barrier layer in the tunnel adjacent to the first gold layer; depositing a thermoelectric layer proximate to the barrier layer and conforming to the shape of the tunnel and the barrier layer; depositing a metal layer adjacent to the thermoelectric layer and conforming to the shape of the thermoelectric layer; and depositing a cap layer on the metal layer. The method may further include a step of removing gold spatter from walls of the tunnel. The method may further include a step of adding an adhesion layer between the substrate and the first gold layer. The method may further include a step of adding an energy filter layer between the barrier layer and the thermoelectric layer. Where the thermoelectric layer is made of alternating composite thermoelectric layers and interlayers, the method may include a step of alternating depositing the interlayers and the composite thermoelectric layer proximate to the barrier layer. The composite thermoelectric layers may include one of: n-type thermoelectric material and p-type thermoelectric material. The interlayers may include a phonon blocking material. The metal layer may include a plurality of sublayers. In one embodiment, the step of depositing the metal layer may include depositing each of the plurality of sublayers.

Another embodiment according to the present disclosure includes a thermoelectric apparatus that includes a thermally and electrically non-conductive substrate having a first surface and a second surface; a first surface first gold layer proximate to the first surface; a first surface nickel layer adjacent to the first surface first gold layer; a first surface second gold layer adjacent to the first surface nickel layer; a second surface first gold layer proximate to the second surface; a second surface nickel layer adjacent to the second surface first gold layer; a second surface second gold layer adjacent to the second surface nickel layer; a first tunnel between the first surface and the second surface and penetrating the second surface first gold layer, the second surface nickel layer, and the second surface second gold layer, where the first tunnel has a first opening in the first surface and a second opening in the second surface; a first barrier layer disposed within the first tunnel proximate to the first surface; a first thermoelectric layer disposed on the substrate within the first tunnel, adjacent to the first barrier layer, and on the second surface second gold layer; a first metal layer disposed on the first thermoelectric layer; a first cap layer disposed on the first metal layer; a second tunnel between the first surface and the second surface and penetrating the first surface first gold layer, the first surface nickel layer, and the first surface second gold layer, where the second tunnel has a first opening in the second surface and a second opening in the first surface; a second barrier layer disposed within the second tunnel proximate to the second surface; a second thermoelectric layer disposed on the substrate within the second tunnel, adjacent to the second barrier layer, and on the first surface second gold layer; a second metal layer disposed on the second thermoelectric layer; and a second cap layer disposed on the second metal layer. The apparatus may also include a first notch breaking electrical continuity in the second surface first gold layer, the second surface nickel layer, and the second surface second gold layer; and a second notch breaking electrical continuity in the first surface first gold layer, the first surface nickel layer, and the first surface second gold layer, wherein the first notch and the second notch are longitudinally separated by the first tunnel. The substrate may be made of one of: a polyimide, a liquid crystal polymer (LCPs), parylene, PTFE, polymer aerogels, and a glass. The substrate may be between about 10 micrometers to about 1000 micrometers thick; the first surface first gold layer may be about first gold layer may be about 400 nanometers thick; the first surface nickel layer may be about 5 micrometers thick; the first surface second gold layer may be about 1 micrometer thick, the second surface first gold layer is about first gold layer may be about 400 nanometers thick; the second surface nickel layer is about 5 micrometers thick; and the second surface second gold layer is about 1 micrometer thick. The first thermoelectric layer may be made of a p-type thermoelectric material, and the second thermoelectric layer may be made of an n-type thermoelectric material. The p-type thermoelectric material may be made of one or more of: BiSb—Te, SiGe—B, Zintl compounds, Yb—Mn—Sb, Ce—Fe—Co—Sb, CePd, CsBiTe, PbTe, and ZnSb. The second thermoelectric layer may be made of an n-type thermoelectric material. The n-type thermoelectric material may be made of one or more of: Bi—Te—Se, SiGe—P, $Mg_3Bi_2$, Mg—Sb—B—Te, InSb, BiSb, PbSe, SnSSe, Half-Heusler alloys, full Heusler alloys, Fe—V—W—Al, Yb—Ba—Co—Sb, La—Te, Pr—Te, SiGe—C, and YbAl. At least one of the first thermoelectric layer and the second thermoelectric layer may include one or more interlayers that alternates with the n-type thermoelectric material or the p-type thermoelectric material, the interlayers being made of one of: TiW, gold, iridium, platinum, tungsten, molybdenum, and InSb. The first barrier layer and the second barrier layer are each about 5 micrometers thick. Each of the first barrier layer and the second barrier layer may be made of one or more of: rhodium, platinum, iridium, tantalum/tantalum nitride, titanium/titanium nitride, chromium, and cobalt. In some embodiments, at least one of the first metal layer and the second metal layer may be made of platinum. In some embodiment, the at least one of the first metal layer and the second metal layer may be made of a first sublayer made of one of: platinum, nickel, TiW, Ta—TaN, titanium, cobalt, iridium, and rhodium; a second sublayer made of one of: platinum, cobalt, and nickel; and a third sublayer made of one of: platinum, gold, and silver; wherein the first sublayer is disposed adjacent to the respective first or second thermoelectric layer and the second sublayer is disposed between the first sublayer and the third sublayer. The first cap layer and the second cap layer may each be made of one of: sintered nano-silver and solder. In some embodiments, the apparatus may also include a first adhesion layer disposed between the first surface of the substrate and the first surface first gold layer; and a second adhesion layer disposed between the second surface of the substrate and the second surface first gold layer. In some embodiments, the apparatus may include a first energy filter layer disposed between the first barrier layer and the first thermoelectric layer; and a second energy filter layer disposed between the second barrier layer and the second thermoelectric layer. In some embodiments, the first energy filter layer and the second energy filter layer may be made of a form of graphene.

Another embodiment according to the present disclosure includes a method for manufacturing a thermoelement, the method including the steps of: preparing a first surface and a second surface of a substrate; forming a thermoelectric device base by: adding a first surface first gold layer proximate to the second surface of the substrate; adding a first surface nickel layer to the first surface first gold layer opposite the substrate; adding a first surface second gold layer to the first surface nickel layer opposite the first surface first gold layer; adding a second surface first gold layer proximate to the first surface of the substrate; adding a second surface nickel layer to the second surface first gold layer opposite the substrate; and adding a second surface second gold layer to the second surface nickel layer opposite the second surface first gold layer; forming a first tunnel in the thermoelectric device base by removing a portion of the second surface second gold layer, a portion of the second surface nickel layer, a portion of the second surface first gold layer, and a portion of the substrate from the second surface to the first surface first gold layer; depositing a first barrier layer in the first tunnel proximate to the first surface first gold layer; depositing a first thermoelectric layer on the substrate within the first tunnel, adjacent to the first barrier layer, and on the first surface second gold layer; depositing a first metal layer on the first thermoelectric layer; depositing a first cap layer on the first metal layer; forming a second tunnel in the thermoelectric device base by removing a portion of the first surface second gold layer, a portion of the first surface nickel layer, a portion of the first surface first gold layer, and a portion of the substrate from the first surface to the second surface first gold layer, where the second tunnel does not overlap with the first tunnel; depositing a second barrier layer in the second tunnel proximate to the second surface first gold layer; depositing a second thermoelectric layer on the substrate within the second tunnel, adjacent to the second barrier layer, and on the second surface second gold layer; depositing a second metal layer on the second thermoelectric layer; and depositing a second cap layer on the second metal layer. In some embodiments, the method may include further steps of forming a first notch breaking electrical continuity in the second surface first gold layer, the second surface nickel layer, and the second surface second gold layer; and forming a second notch breaking electrical continuity in the first surface first gold layer, the first surface nickel layer, and the first surface second gold layer, wherein the first notch and the second notch are longitudinally separated by the first tunnel. In some embodiments, another step in the method may be removing gold spatter on the substrate in at least one of the first tunnel and the second tunnel. In some embodiments, another step in the method may be adding an adhesion layer between at least one of: the substrate and the first surface first gold layer; and the substrate and the second surface first gold layer. In some embodiments, the method may include a step of adding an energy filter layer between at least one of: the first surface barrier layer and the first surface thermoelectric layer; and the second surface barrier layer and the second surface thermoelectric layer. At least one of the first thermoelectric layer and the second thermoelectric layer may include composite thermoelectric layers; and interlayers comprising a phonon blocking material; and the step of depositing the first thermoelectric layer may include alternating depositing the interlayers and the composite thermoelectric layer proximate to the first barrier layer. In some embodiments, at least one of the first metal layer and the second metal layer may be made up of a plurality of sublayers; and at least one of the steps of depositing the first metal layer and depositing the second metal layer may include depositing each of the plurality of sublayers.

Another embodiment according to the present disclosure includes a thermoelectric apparatus that includes a thermally and electrically non-conductive substrate having a first surface and a second surface; a first surface first gold layer proximate to the first surface; a first surface nickel layer adjacent to the first surface first gold layer; a first surface second gold layer adjacent to the first surface nickel layer; a second surface first gold layer proximate to the second surface; a second surface nickel layer adjacent to the second surface first gold layer; a second surface second gold layer adjacent to the second surface nickel layer; a first tunnel between the first surface and the second surface and penetrating the second surface first gold layer, the second surface nickel layer, and the second surface second gold layer, where the first tunnel has a first opening in the first surface and a second opening in the second surface; a first barrier layer disposed within the first tunnel proximate to the first surface; a first thermoelectric layer disposed on the substrate within the first tunnel, adjacent to the first barrier layer, and on the second surface second gold layer; a second tunnel between the first surface and the second surface and penetrating the first surface first gold layer, the first surface nickel layer, and the first surface second gold layer, where the second tunnel has a first opening in the second surface and a second opening in the first surface; a second barrier layer disposed within the second tunnel proximate to the second surface; and a second thermoelectric layer disposed on the substrate within the second tunnel, adjacent to the second barrier layer, and on the first surface second gold layer. The apparatus may also include a first notch breaking electrical continuity in the second surface first gold layer, the second surface nickel layer, and the second surface second gold layer; and a second notch breaking electrical continuity in the first surface first gold layer, the first surface nickel layer, and the first surface second gold layer, wherein the first notch and the second notch are longitudinally separated by the first tunnel. The apparatus may also include a first cap layer disposed in the first tunnel on the first thermoelectric layer and a second cap layer disposed in the second tunnel on the second thermoelectric layer. The first cap layer and the second cap layer may each be made of one of: sintered nano-silver and solder. The substrate may be made of one of: a polyimide, a liquid crystal polymer (LCPs), parylene, PTFE, polymer aerogels, and a glass. The substrate may be between about 10 micrometers to about 1000 micrometers thick; the first surface first gold layer may be about first gold layer may be about 400 nanometers thick; the first surface nickel layer may be about 5 micrometers thick; the first surface second gold layer may be about 1 micrometer thick, the second surface first gold layer is about first gold layer may be about 400 nanometers thick; the second surface nickel layer is about 5 micrometers thick; and the second surface second gold layer is about 1 micrometer thick. The first thermoelectric layer may be made of a p-type thermoelectric material, and the second thermoelectric layer may be made of an n-type thermoelectric material. The p-type thermoelectric material may be made of one or more of: BiSb—Te, SiGe—B, Zintl compounds, Yb—Mn—Sb, Ce—Fe—Co—Sb, CePd, CsBiTe, PbTe, and ZnSb. The second thermoelectric layer may be made of an n-type thermoelectric material. The n-type thermoelectric material may be made of one or more of: Bi—Te—Se, SiGe—P, $Mg_3Bi_2$, Mg—Sb—B—Te, InSb, BiSb, PbSe, SnSSe, Half-Heusler alloys, full Heusler alloys, Fe—V—W—Al, Yb—Ba—Co—Sb, La—Te, Pr—Te, SiGe—C, and YbAl. At least one of the first thermoelectric layer and the second thermoelectric layer may include one or more interlayers that alternates with the n-type thermoelectric material or the p-type thermoelectric material, the interlayers being made of one of: TiW, gold, iridium, platinum, tungsten, molybdenum, and InSb. The first barrier layer and the second barrier layer are each about 5 micrometers thick. Each of the first barrier layer and the second barrier layer may be made of one or more of: rhodium, platinum, iridium, tantalum/tantalum nitride, titanium/titanium nitride, chromium, and cobalt. In some embodiments, the apparatus may also include a first adhesion layer disposed between the first surface of the substrate and the first surface first gold layer; and a second adhesion layer disposed between the second surface of the substrate and the second surface first gold layer. In some embodiments, the apparatus may include a first energy filter layer disposed between the first barrier layer and the first thermoelectric layer; and a second energy filter layer disposed between the second barrier layer and the second thermoelectric layer. In some embodiments, the first energy filter layer and the second energy filter layer may be made of a form of graphene.

Another embodiment according to the present disclosure includes a method for manufacturing a thermoelement, the method including the steps of: preparing a first surface and a second surface of a substrate; forming a thermoelectric device base by: adding a first surface first gold layer proximate to the second surface of the substrate; adding a first surface nickel layer to the first surface first gold layer opposite the substrate; adding a first surface second gold layer to the first surface nickel layer opposite the first surface first gold layer; adding a second surface first gold layer proximate to the first surface of the substrate; adding a second surface nickel layer to the second surface first gold layer opposite the substrate; and adding a second surface second gold layer to the second surface nickel layer opposite the second surface first gold layer; forming a first tunnel in the thermoelectric device base by removing a portion of the second surface second gold layer, a portion of the second surface nickel layer, a portion of the second surface first gold layer, and a portion of the substrate from the second surface to the first surface first gold layer; depositing a first barrier layer in the first tunnel proximate to the first surface first gold layer; depositing a first thermoelectric layer on the substrate within the first tunnel, adjacent to the first barrier layer, and on the first surface second gold layer; forming a second tunnel in the thermoelectric device base by removing a portion of the first surface second gold layer, a portion of the first surface nickel layer, a portion of the first surface first gold layer, and a portion of the substrate from the first surface to the second surface first gold layer, where the second tunnel does not overlap with the first tunnel; depositing a second barrier layer in the second tunnel proximate to the second surface first gold layer; and depositing a second thermoelectric layer on the substrate within the second tunnel, adjacent to the second barrier layer, and on the second surface second gold layer. In some embodiments, the method may include further steps of forming a first notch breaking electrical continuity in the second surface first gold layer, the second surface nickel layer, and the second surface second gold layer; and forming a second notch breaking electrical continuity in the first surface first gold layer, the first surface nickel layer, and the first surface second gold layer, wherein the first notch and the second notch are longitudinally separated by the first tunnel. In some embodiments, another step in the method may be depositing a first cap layer in the first tunnel on the first thermoelectric layer and depositing a second cap layer in the second tunnel on the second thermoelectric layer. In some embodiments, another step in the method may be removing gold spatter on the substrate in at least one of the first tunnel and the second tunnel. In some embodiments, another step in the method may be adding an adhesion layer between at least one of: the substrate and the first surface first gold layer; and the substrate and the second surface first gold layer. In some embodiments, the method may include a step of adding an energy filter layer between at least one of: the first surface barrier layer and the first surface thermoelectric layer; and the second surface barrier layer and the second surface thermoelectric layer. At least one of the first thermoelectric layer and the second thermoelectric layer may include composite thermoelectric layers; and interlayers comprising a phonon blocking material; and the step of depositing the first thermoelectric layer may include alternating depositing the interlayers and the composite thermoelectric layer proximate to the first barrier layer.

Another embodiment according to the present disclosure includes a thermoelectric apparatus that includes a thermally and electrically non-conductive substrate having a first surface and a second surface; a first surface first gold layer proximate to the first surface; a first surface nickel layer adjacent to the first surface first gold layer; a first surface second gold layer adjacent to the first surface nickel layer; a second surface first gold layer proximate to the second surface; a second surface nickel layer adjacent to the second surface first gold layer; a second surface second gold layer adjacent to the second surface nickel layer; a first tunnel between the first surface and the second surface and penetrating the second surface first gold layer, the second surface nickel layer, and the second surface second gold layer, where the first tunnel has a first opening in the first surface and a second opening in the second surface; a first thermoelectric layer disposed on the substrate within the first tunnel, adjacent to the first surface first gold layer, and on the second surface second gold layer; a second tunnel between the first surface and the second surface and penetrating the first surface first gold layer, the first surface nickel layer, and the first surface second gold layer, where the second tunnel has a first opening in the second surface and a second opening in the first surface; and a second thermoelectric layer disposed on the substrate within the second tunnel, adjacent to the second surface first gold layer, and on the first surface second gold layer. The apparatus may also include a first notch breaking electrical continuity in the second surface first gold layer, the second surface nickel layer, and the second surface second gold layer; and a second notch breaking electrical continuity in the first surface first gold layer, the first surface nickel layer, and the first surface second gold layer, wherein the first notch and the second notch are longitudinally separated by the first tunnel. The substrate may be made of one of: a polyimide, a liquid crystal polymer (LCPs), parylene, PTFE, polymer aerogels, and a glass. The substrate may be between about 10 micrometers to about 1000 micrometers thick; the first surface first gold layer may be about first gold layer may be about 400 nanometers thick; the first surface nickel layer may be about 5 micrometers thick; the first surface second gold layer may be about 1 micrometer thick, the second surface first gold layer is about first gold layer may be about 400 nanometers thick; the second surface nickel layer is about 5 micrometers thick; and the second surface second gold layer is about 1 micrometer thick. The first thermoelectric layer may be made of a p-type thermoelectric material, and the second thermoelectric layer may be made of an n-type thermoelectric material. The p-type thermoelectric material may be made of one or more of: BiSb—Te, SiGe—B, Zintl compounds, Yb—Mn—Sb, Ce—Fe—Co—Sb, CePd, CsBiTe, PbTe, and ZnSb. The second thermoelectric layer may be made of an n-type thermoelectric material. The n-type thermoelectric material may be made of one or more of: Bi—Te—Se, SiGe—P, $Mg_3Bi_2$, Mg—Sb—B—Te, InSb, BiSb, PbSe, SnSSe, Half-Heusler alloys, full Heusler alloys, Fe—V—W—Al, Yb—Ba—Co—Sb, La—Te, Pr—Te, SiGe—C, and YbAl. At least one of the first thermoelectric layer and the second thermoelectric layer may include one or more interlayers that alternates with the n-type thermoelectric material or the p-type thermoelectric material, the interlayers being made of one of: TiW, gold, iridium, platinum, tungsten, molybdenum, and InSb. In some embodiments, the apparatus may also include a first adhesion layer disposed between the first surface of the substrate and the first surface first gold layer; and a second adhesion layer disposed between the second surface of the substrate and the second surface first gold layer.

Another embodiment according to the present disclosure includes a method for manufacturing a thermoelement, the method including the steps of: preparing a first surface and a second surface of a substrate; forming a thermoelectric device base by: adding a first surface first gold layer proximate to the second surface of the substrate; adding a first surface nickel layer to the first surface first gold layer opposite the substrate; adding a first surface second gold layer to the first surface nickel layer opposite the first surface first gold layer; adding a second surface first gold layer proximate to the first surface of the substrate; adding a second surface nickel layer to the second surface first gold layer opposite the substrate; and adding a second surface second gold layer to the second surface nickel layer opposite the second surface first gold layer; forming a first tunnel in the thermoelectric device base by removing a portion of the second surface second gold layer, a portion of the second surface nickel layer, a portion of the second surface first gold layer, and a portion of the substrate from the second surface to the first surface first gold layer; depositing a first thermoelectric layer on the substrate within the first tunnel, adjacent to the first surface first gold layer, and on the second surface second gold layer; forming a second tunnel in the thermoelectric device base by removing a portion of the first surface second gold layer, a portion of the first surface nickel layer, a portion of the first surface first gold layer, and a portion of the substrate from the first surface to the second surface first gold layer, where the second tunnel does not overlap with the first tunnel; and depositing a second thermoelectric layer on the substrate within the second tunnel, adjacent to the second surface first gold layer, and on the first surface second gold layer. In some embodiments, the method may include further steps of forming a first notch breaking electrical continuity in the second surface first gold layer, the second surface nickel layer, and the second surface second gold layer; and forming a second notch breaking electrical continuity in the first surface first gold layer, the first surface nickel layer, and the first surface second gold layer, wherein the first notch and the second notch are longitudinally separated by the first tunnel. In some embodiments, another step in the method may be removing gold spatter on the substrate in at least one of the first tunnel and the second tunnel. In some embodiments, another step in the method may be adding an adhesion layer between at least one of: the substrate and the first surface first gold layer; and the substrate and the second surface first gold layer. At least one of the first thermoelectric layer and the second thermoelectric layer may include composite thermoelectric layers; and interlayers comprising a phonon blocking material; and the step of depositing the first thermoelectric layer may include alternating depositing the interlayers and the composite thermoelectric layer proximate to the first surface first gold layer.

Examples of the more important features of the disclosure have been summarized rather broadly in order that the detailed description thereof that follows may be better understood and in order that the contributions they represent to the art may be appreciated. There are, of course, additional features of the disclosure that will be described hereinafter and which will form the subject of the claims appended hereto.

BRIEF DESCRIPTION OF THE DRAWINGS

For a detailed understanding of the present disclosure, reference should be made to the following detailed description of the embodiments, taken in conjunction with the accompanying drawings, in which like elements have been given like numerals, wherein.

DETAILED DESCRIPTION OF THE DISCLOSURE

Figure 1:
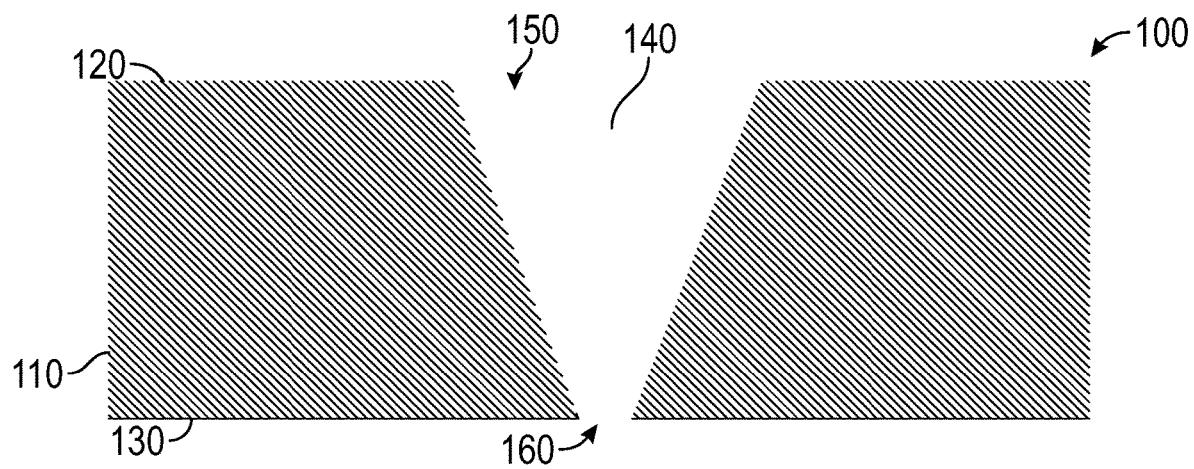
FIG. 1 is a diagram of a cross-section of substrate for a thermoelement according to one embodiment of the present disclosure.

Generally, the present disclosure relates to apparatuses and methods for converting a heat energy to electrical energy and converting electrical energy into heat energy, and, in particular, generating temperature differentials and generating electrical power. The present disclosure is susceptible to embodiments of different forms. They are shown in the drawings, and herein will be described in detail, specific embodiments of the present disclosure with the understanding that the present disclosure is to be considered an exemplification of the principles of the present disclosure and is not intended to limit the present disclosure to that illustrated and described herein.

FIG. 1 shows a diagram of a substrate 100. The substrate 100 includes a thermally and electrically insulating layer 110. The layer 110 has a first side 120 and a second side 130.

In some embodiments, the layer 110 may be about 10 to about 1000 micrometers in thickness. The layer 110 may be made of a suitable thermally and electrically insulating material as would be understood by a person of skill in the art. In some embodiments, the layer 110 may be made of one of: silica glass, aluminosilicate glass, silicon, aluminum nitride, alumina, polyimide, nylon, FR4, quartz, sapphire, diamond, fused-silica glass. In some embodiments, the layer 110 may include a coating of parylene, polyimides, polymer aerogels, or spin-on-glass. A tunnel or via 140 may be formed between the first side 120 and the second side 130 through the layer 110. The tunnel 140 may be wider at the first side 120 than at the second side 130. In some embodiments, the tunnel 140 may be frustum shaped; however, this is exemplary and illustrative only, as the tunnel 140 may be cylindrical shaped or an irregular shape. In some embodiments, the tunnel 140 has an opening 150 on the first side 120 that has a greater cross-sectional area than an opening 160 on the second side 130. In some embodiments, the openings 150, 160 may be circular. In some embodiments, the opening 150 may have a diameter of about 10 to about 200 micrometers, and the opening 160 may have a diameter of about 1 to about 100 micrometers. In some embodiments, the diameter of the opening 150 may be about 1 to 200 times the diameter of the opening 160. In some embodiments, the opening 150 may be about 2 to 10 times the diameter of the opening 160. In some embodiments, the opening 150 may have a different shape than the opening 160.

Figure 2:
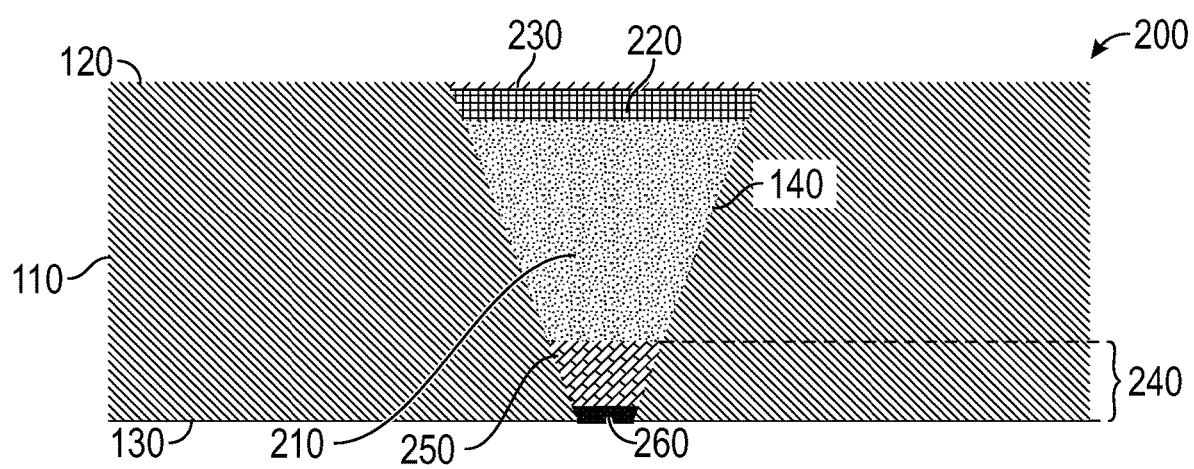
FIG. 2 is a diagram of a cross-section of the substrate of FIG. 1 when filled according to one embodiment of the present disclosure.

FIG. 2 shows a diagram of a filled substrate 200, that includes the substrate 100 and additional layers deposited in the tunnel 140. The tunnel 140 may include a via body 210. The via body 210 may be made of a material that is electrically and thermally conductive. In some embodiments, the via body 210 may be made of one of: copper, nickel, rhodium, iridium, gold, platinum, silver, tungsten, molybdenum, and cobalt. The via body 210 may be about 1 to about 1000 micrometers in thickness and conform to the lateral dimensions of the tunnel 140. In some embodiments, the materials of the via body 210 and the substrate material 110 may be selected such that their coefficients of thermal expansion are matched or approximately the same. In some embodiments, the materials of the via body 210 and the substrate material 110 may have coefficients of thermal expansion of about 7 ppm/° C. Proximate to the first side 120 and adjacent to the via body 210 may be bottom layers 220, 230. The first bottom layer 220 is adjacent to the via body 210. In some embodiments, the first bottom layer 220 may be made of platinum, nickel, or cobalt. In some embodiments, the first bottom layer 220 may be about 1 to about 2 micrometers in thickness and laterally conforming to the sides of the tunnel 140. The second bottom layer 230 is adjacent to the first bottom layer 220 and not the in direct contact with the via body 210. In some embodiments, the second bottom layer 230 may be made of gold or platinum. In some embodiments, the second bottom layer 230 may be about 50 to about 500 nanometers in thickness.

On the other side of the via body 210, a base layer 240 may be deposited. The base barrier layer 240 may be made of materials selected to resist diffusion into the via body 210. The base barrier layer 240 may fill or slightly overfill the tunnel 240 on the second side 130 and conforms to the shape of the tunnel 140. The base barrier layer 240 may include base barrier sublayers 250, 260. As shown, the base barrier layer 240 includes a first base barrier sublayer 250 and a second base barrier sublayer 260. In some embodiments, the first base barrier sublayer 250 may be made of rhodium, platinum, iridium, tantalum/tantalum nitride, titanium/titanium nitride, chromium, or cobalt. In some embodiments, the first base barrier sublayer 250 may be about 1 to about 100 micrometers in thickness. In some embodiments, the second base barrier sublayer 260 may be made of rhodium, platinum, iridium, tantalum/tantalum nitride, titanium/titanium nitride, chromium, or cobalt. In some embodiments, the second base barrier sublayer 260 may be made of high power-factor thermoelectric materials that have a product of electrical conductivity σ and the square of Seebeck coefficients S such that $\sigma S^2 > 0.001$ $Wm^{-1}K^{-2}$. The high power-factor thermoelectric materials may include, but are not limited to, one or more of: Kondo intermetallics, $YbAl_3$ and $CePd_3$, skutterudites, $CoSb_3$, and full Heusler Fe—V—W—Al. In some embodiments, the second base barrier sublayer 260 may be about 1 to about 1000 nanometers in thickness. In some embodiments, the first base barrier sublayer 250 may be substantially thicker than the second base sublayer 260. In some embodiments, the first base sublayer 250 may be about 1 to about 1000 times thicker than the second base sublayer 260. In some embodiments, the first base sublayer 250 may be about 10 to about 100 times thicker than the second base sublayer 260. In some embodiments, the base layer 240 may only include one material, and not have sublayers. In some embodiments, the base layer 240 may include one or more of: rhodium, iridium, tantalum/tantalum nitride, titanium/titanium nitride, chromium, and cobalt. In some embodiments, the sublayers 250, 260 may be pairs of materials such as i) rhodium and iridium, ii) tantalum and tantalum nitride, iii) titanium and titanium nitride, and iv) cobalt and nickel.

Figure 3:
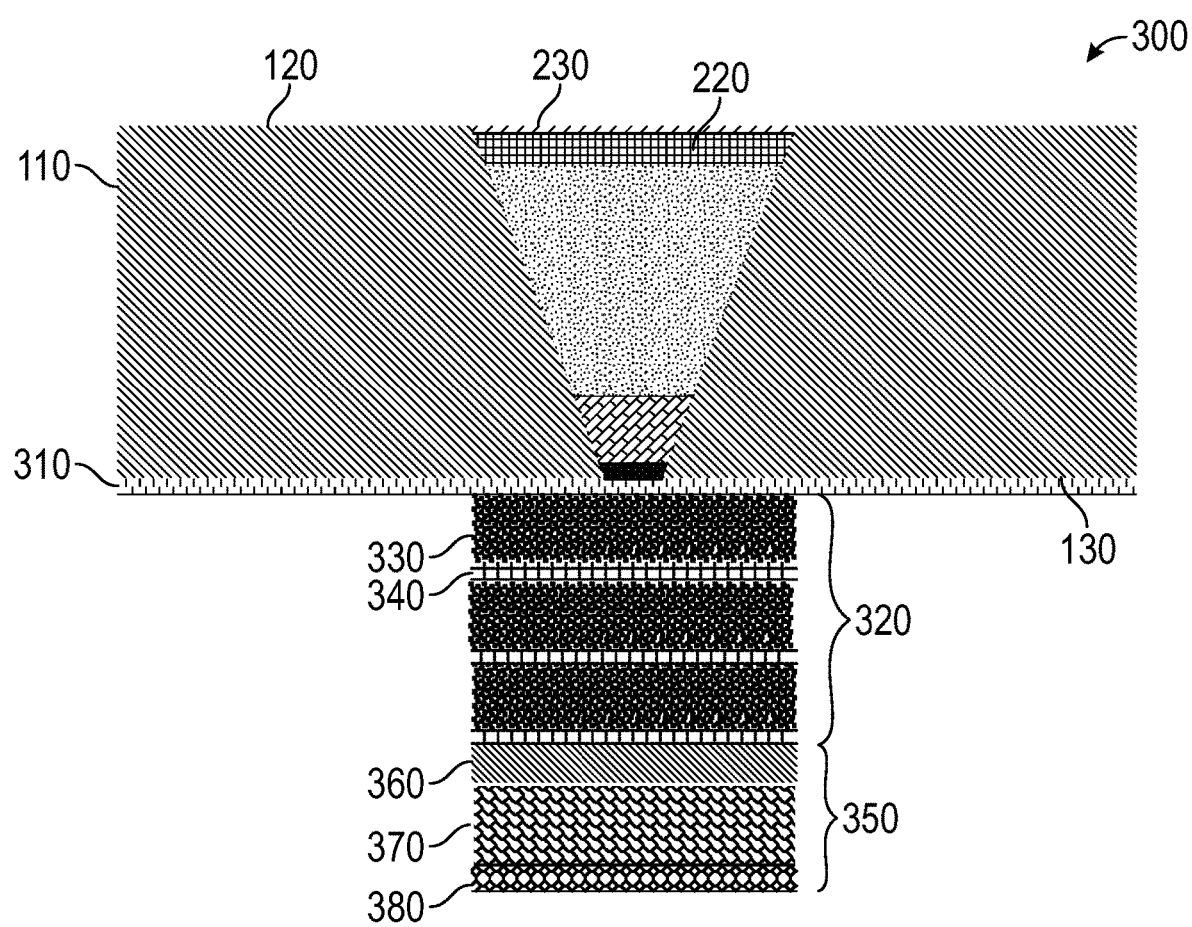
FIG. 3 is a diagram of a thermoelement formed using the filled substrate of FIG. 2 according to one embodiment of the present disclosure.

FIG. 3 shows a diagram of the filled substrate 200 as a thermoelement 300. The diagram may show exaggerated thicknesses of some of the elements so that all of the elements are easily viewable. An adhesion layer 310 may be disposed on the second side 130 of the substrate 110 and adjacent to the base layer 240. In some embodiments, the adhesion layer 310 may be made of one of: titanium, chromium, zirconium, and hafnium. In some embodiments, the adhesion layer 310 may be about 5 to about 30 nanometers in thickness. A thermoelectric layer 320 may be disposed adjacent to the barrier layer 310 proximate to the base layer 240. The thermoelectric layer 320 may laterally extend 1 to 3 diameters of the opening 160 beyond the perimeter of the base layer 240 at the opening 160. The thermoelectric layer 320 may be made of one or more alternating composite thermoelectric layers 330 and interlayers 340, with the initial composite thermoelectric layer proximate to the barrier layer 310. The composite thermoelectric layers 330 may be made of n-type or p-type material. In some embodiments, n-type materials may include one or more of: Bi—Te—Se, SiGe—P, $Mg_3Bi_2$, Mg—Sb—B—Te, InSb, BiSb, PbSe, SnSSe, Half-Heusler alloys, full Heusler alloys, Fe—V—W—Al, Yb—Ba—Co—Sb, La—Te, Pr—Te, SiGe—C, and YbAl. In some embodiments, p-type materials may include one or more of: BiSb—Te, SiGe—B, Zintl compounds, Yb—Mn—Sb, Ce—Fe—Co—Sb, CePd, CsBiTe, PbTe, and ZnSb. In some embodiments, n-type or p-type composite thermoelectric layers may be formed by annealing two different materials in a specific ratio, such as $Bi_2Te$ and $Bi_2Se$ in a 9:1 ratio to form $Bi_2Te_{2.7}Se_{0.3}$. The interlayers 340 are selected for their phonon blocking properties.

In some embodiments, the composite thermoelectric layers 330 may be about 5 to about 500 nanometers in thickness. In some embodiments, the interlayers 340 may be made of one of: TiW, gold, iridium, platinum, tungsten, molybdenum, and InSb. In some embodiments, the interlayers 340 may be about 1 to about 10 nanometers in thickness.

A top layer 350 may be disposed adjacent to the thermoelectric layer 320. In some embodiments, the top layer 350 may be made of platinum. The top layer 350 may be homogenous or contain sub top layers. As shown, the top layer 350 includes a first sub top layer 360, a second sub top layer 370, and a third sub top layer 380, with the first sub top layer 360 being proximate to the thermoelectric layer 320 and the third sub top layer 380 being distal to the thermoelectric layer 320. In some embodiments, the first sub top layer 360 may be made of one of: platinum, cobalt, nickel, TiW, titanium, iridium, and rhodium. In some embodiments, the first sub top layer 360 may be about 10 to about 1000 nanometers in thickness. In some embodiments, the second sub top layer 370 may be made of one of: platinum, cobalt, and nickel. In some embodiments, the second sub top layer 370 may be about 1 to about 2 micrometers in thickness. In some embodiments, the third sub top layer 380 may be made of one of: platinum and gold. In some embodiments, the third sub top layer 380 may be about 50 to about 500 nanometers in thickness.

Figure 4:
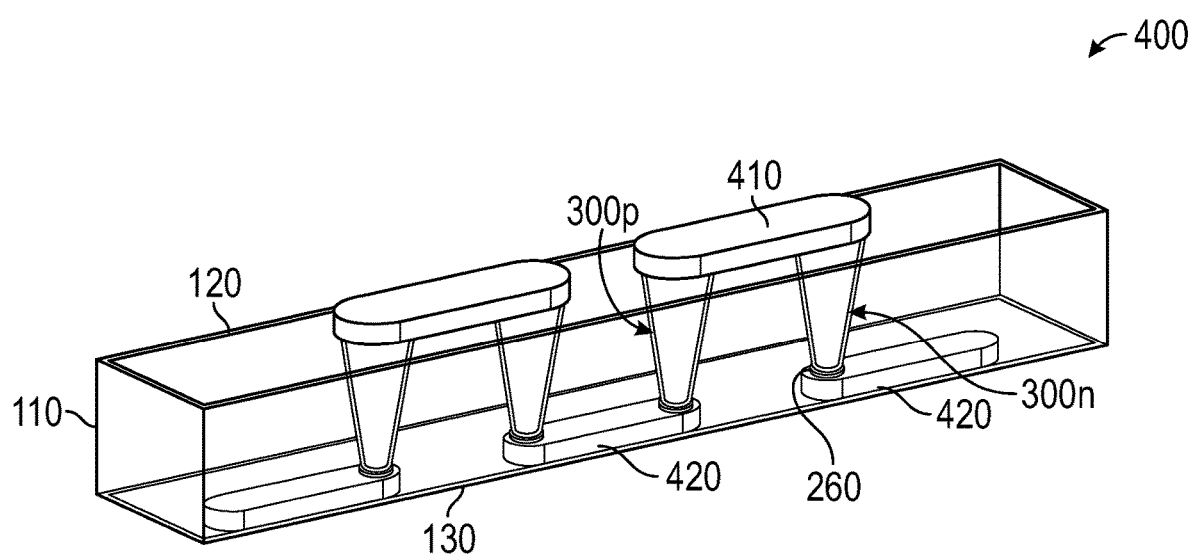
FIG. 4 is a 3-D diagram of a set of thermoelements arranged for use in a thermoelectric device according to one embodiment of the present disclosure.

FIG. 4 shows a 3-D diagram of a thermoelectric device 400. The thermoelectric device 400 includes alternating thermoelements 300 of n-type 300$n$ and p-type 300$p$. The substrate 110 extends continuously between multiple thermoelements 300. In some embodiments, the substrate 110 may have hundreds or thousands of n-type thermoelement 300$n$ and p-type thermoelement 300$p$ pairs. Electrical conductors 410, 420 may be disposed between thermoelements 300$n$, 300$p$ in an alternating pattern offset between the first side 120 and the second side 130 such that electric current may pass through multiple sets of thermoelements 300$n$, 300$p$, as would be understood by a person of skill in the art. The electrical conductors may be metallic or another conductive material (graphene, etc.) and may be solid or plated. In some embodiments, the electrical conductors 410, 420 may be made of one of: copper, silver, gold, nickel, cobalt, molybdenum, aluminum, tungsten copper alloy, copper aluminum composite, and aluminum. In some embodiments, the electrical conductors may be copper with coating or plating of nickel, gold, platinum/gold alloy, or silver. In some embodiments, the electrical conductors may be nickel with coating or plating of gold, platinum/gold alloy, or silver. In some embodiments, the electrical conductors may be cured layers of electrically conductive inks, including, but not limited to, conductive copper inks or conductive silver inks. In some embodiments, the electrical conductors may be about 1 to about 100 micrometers in thickness.

Figure 5:
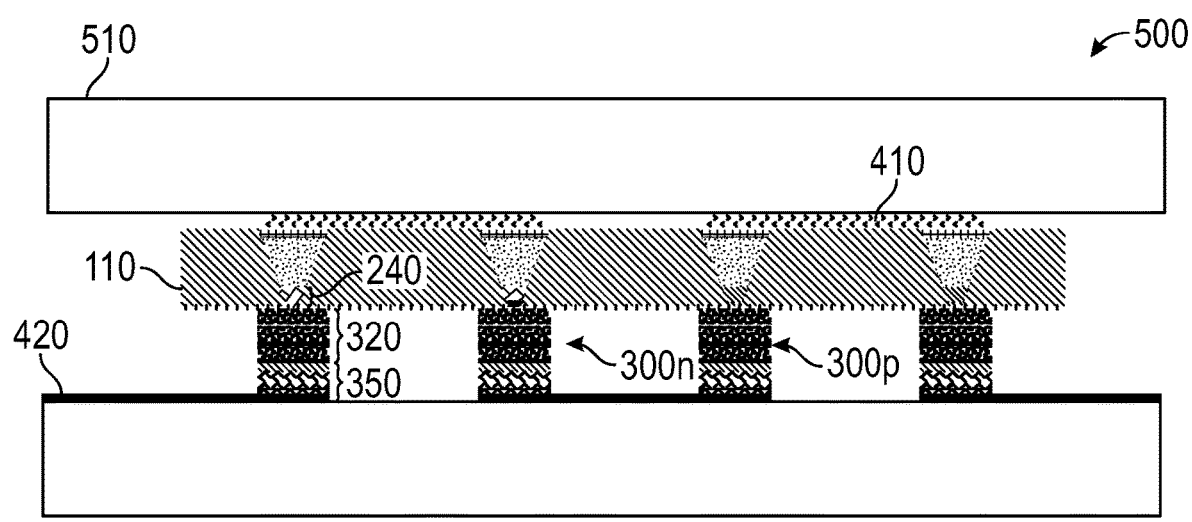
FIG. 5 is a diagram of side view a set of thermoelements of FIG. 4 with electrical insulation layers.

FIG. 5 shows a diagram of a side view of a thermoelectric device 500 based on the thermoelectric device 400 of FIG. 4. The thermoelectric device 500 includes the thermoelectric device 400 sandwiched between insulation layers 510. The insulation layers 510 are electrically insulating but thermally conductive. In some embodiments, insulation layers 510 may be made of one of: epoxy with boron nitride or aluminum nitride fillers, boron nitride, aluminum nitride, alumina, diamond-like carbon, thermally conductive polymers with graphene filling, hexagonal boron nitride, graphene oxide, and diamond. In some embodiments, the insulation layers 510 may be about 1 to about 10 micrometers in thickness.

Figure 6:
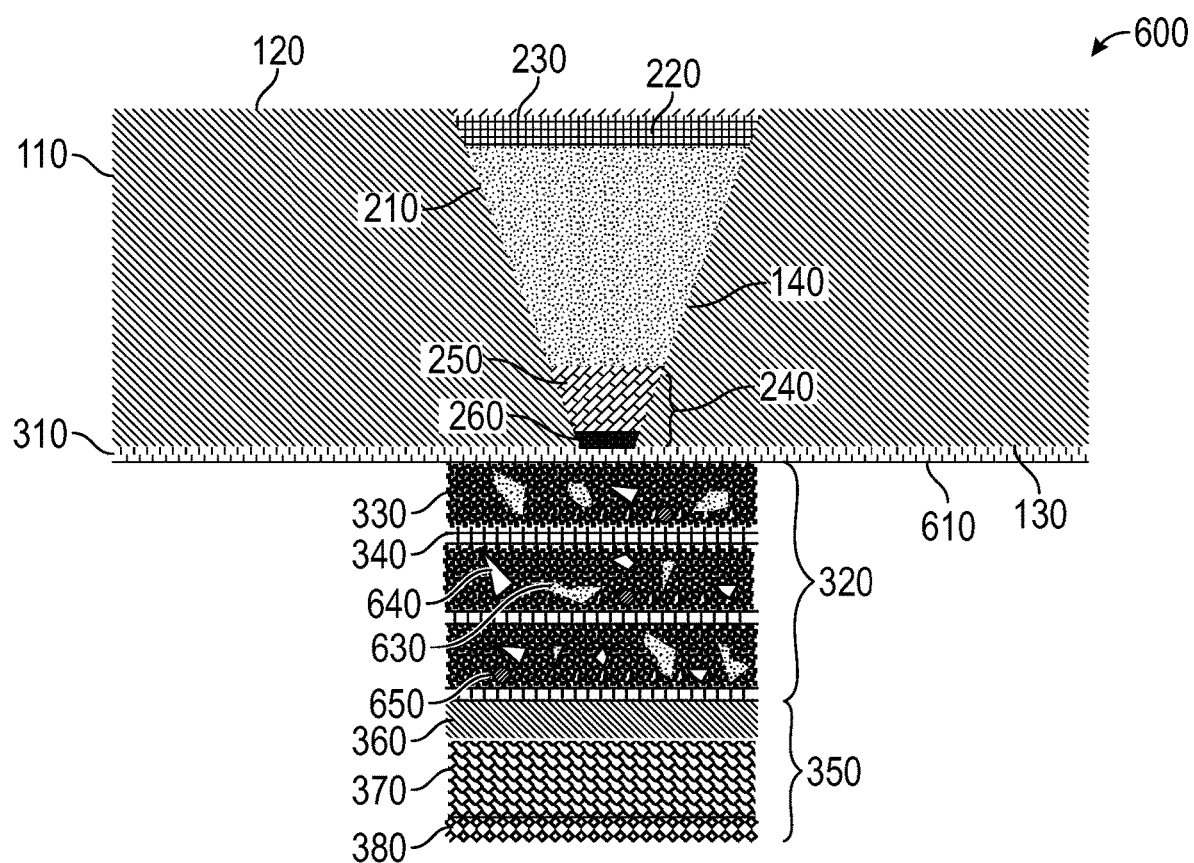
FIG. 6 is a diagram of a thermoelement formed using the filled substrate of FIG. 2 according to another embodiment of the present disclosure.

FIG. 6 shows a diagram of the filled substrate 200 as a thermoelement 600. The diagram may show exaggerated thicknesses of some of the elements so that all of the elements are easily viewable. Several of the layers may be the same as in the thermoelement 300. The adhesion layer 310 may be disposed on the second side 130 of the substrate 110 and adjacent to the base layer 240. In some embodiments, the adhesion layer 310 may be made of one of: titanium, chromium, zirconium, and hafnium. In some embodiments, the adhesion layer 310 may be about 1 to about 10 nanometers in thickness. Adjacent to the adhesion layer 310 may be an energy filter 610. The energy filter 610 may be only a single layer or few layers of atoms in thickness. The energy filter 610 may be configured to block the movement of low energy electrons or holes. The energy filter 610 is selected to increase the Seebeck coefficient of the apparatus 600. In some embodiments, the energy filter 610 may be made of two-dimensional electron gas (2DEG) structures, twisted layers of graphene, layers of hexagonal boron nitride (HBN) and graphene, silicene, phosphene, or SiTe. Adjacent to the energy filter 610 may be a thermoelectric layer 320. The thermoelectric layer 320 may laterally extend 1 to 3 diameters of the opening 160 beyond the perimeter of the base layer 240 at the opening 160. The thermoelectric layer 320 may be made of one or more alternating composite thermoelectric layers 330 and interlayers 340, with the initial composite thermoelectric layer proximate to the energy filter 610. The composite thermoelectric layers 330 may be made of n-type or p-type material. In some embodiments, n-type materials may include one or more of: Bi—Te—Se, SiGe—P, $Mg_3Bi_2$, Mg—Sb—B—Te, InSb, BiSb, PbSe, SnSSe, Half-Heusler alloys, full Heusler alloys, Fe—V—W—Al, Yb—Ba—Co—Sb, La—Te, Pr—Te, SiGe—C, and YbAl. In some embodiments, p-type materials may include one or more of: BiSb—Te, SiGe—B, Zintl compounds, Yb—Mn—Sb, Ce—Fe—Co—Sb, CePd, CsBiTe, PbTe, and ZnSb. In some embodiments, n-type or p-type composite thermoelectric layers may be formed by annealing two different materials in a specific ratio, such as $Bi_2Te$ and $Bi_2Se$ in a 9:1 ratio to form $Bi_2Te_{2.7}Se_{0.3}$.

In some embodiments, the composite thermoelectric layers 330 may each be about 5 to about 500 nanometers in thickness. In some embodiments, the interlayers 340 may be made of one of: TiW, gold, iridium, platinum, tungsten, molybdenum, graphene, and InSb. In some embodiments, the interlayers 340 may each be about 1 to about 10 nanometers in thickness. The composite thermoelectric layers 330 may include grains 630 that may form during annealing (at about 350 degrees C.). The sizes of the grains 630 may be controlled by altering one or more of: the time of annealing, the temperature of annealing, and spacing of the interlayers 340 relative to the composite thermoelectric layers 330. The composite thermoelectric layers 330 may also include voids 640 that may be formed during a quenching step that takes place after annealing to cool down the composite thermoelectric layers 330. The sizes of the voids 640 may be controlled by altering one or more of: the time of annealing, the temperature of annealing, and spacing of the interlayers 340 relative to the composite thermoelectric layers 330. The grains 630 and the voids 640 may reduce the thermal conductance in the composite thermoelectric layers 330. In some embodiments, an optional dopant 650 may be added, such as, but not limited to, gold or Ag or Pt or Ir. In some embodiments, the dopant 650 may be about 1 nanometer in diameter and diffused throughout the composite thermoelectric layer 330 during annealing.

A top layer 350 may be disposed adjacent to the thermoelectric layer 320. In some embodiments, the top layer 350 may be made of platinum. The top layer 350 may be homogenous or contain sub top layers. As shown, the top layer 350 includes a first sub top layer 360, a second sub top layer 370, and a third sub top layer 380, with the first sub top layer 360 being proximate to the thermoelectric layer 320 and the third sub top layer 380 being distal to the thermoelectric layer 320. In some embodiments, the first sub top layer 360 may be made of one of: platinum, cobalt, nickel, TiW, titanium, iridium, and rhodium. In some embodiments, the first sub top layer 360 may be about 10 to about 1000 nanometers in thickness. In some embodiments, the second sub top layer 370 may be made of one of: platinum, cobalt, and nickel. In some embodiments, the second sub top layer 370 may be about 1 to about 2 micrometers in thickness. In some embodiments, the third sub top layer 380 may be made of one of: platinum and gold. In some embodiments, the third sub top layer 380 may be about 50 to about 500 nanometers in thickness.

In operation, the temperatures of electrons and phonons depend on the intensity of electron-phonon interactions within the composite thermoelectric layers 330. The thermal conductivity of the apparatus 600 is dependent on the ratio of the thickness t of the composite thermoelectric layers 330 to the thermalization length Λ, and the electron/phonon thermal conductivities, $\lambda_e$ and $\lambda_p$ respectively:

$$\lambda = \frac{\lambda_e(\lambda_e + \lambda_p)}{\lambda_e + \lambda_e[\tanh(t/\Lambda)/(t/\Lambda)]}.$$

Note that $\lambda \rightarrow \lambda_e$ for t<<Λ. For example, the characteristic thermalization lengths Λ for Bi—Sb—Te and the Bi—Te—Se systems are in the range 500-700 nm. The apparatus 600 has a thickness t ~200-400 nm of the composite layers 330, and the phonon-glass-electron-crystal limit with the figure-of-merit $$ZT = \frac{S^2 \sigma T}{\lambda} \rightarrow \frac{S^2 \sigma T}{\lambda_e} = S^2/L_{0t},$$

$L_{0t}$ being the Lorentz number for the material system (for p-type materials, $\sqrt{L_{0t}}$=130 μV/K). Hence, with typical Seebeck coefficient S in the range 200-240 μV/K, ZT>3. The parasitic thermal conduction, fill-factor ratio, and electrical interface losses may lower the performance of structure to ZT ~2. By further adding energy filters 610, emission properties at the controlled at the interface and high entropy electrons selected. Using energy filters with graphene structures twisted with special magic angles and emission effects (similar to the Bénard-Rayleigh convection), the Seebeck coefficients S>(πk$_B$)/e=270 μV/K for the apparatus 600. This indicates that ZT=S²/L$_{0t}$~4.

Figure 7:
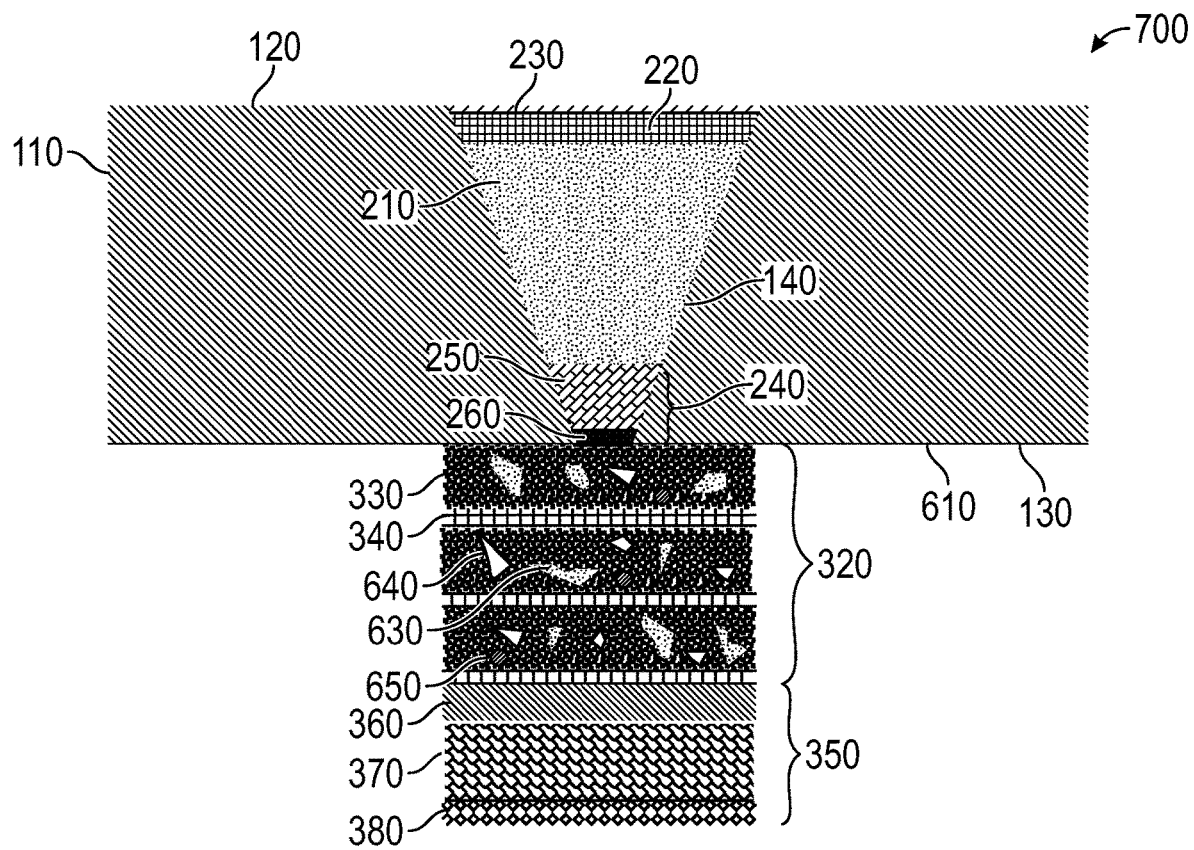
FIG. 7 is a diagram of a thermoelement formed using the filled substrate of FIG. 2 without the adhesion layer according to another embodiment of the present disclosure.

FIG. 7 shows a diagram of the filled substrate 200 as a thermoelement 700. The diagram may show exaggerated thicknesses of some of the elements so that all of the elements are easily viewable. Several of the layers may be the same as in the thermoelement 600; however, herein the adhesion layer 310 is not present, since adhesion layer 310 is optional when the energy filter 610 is made of graphene or twisted graphene layers. The energy filter 610 is disposed on the second side 130 of the substrate 110 and adjacent to the base layer 240. The energy filter 610 may be only a single layer or few layers of atoms in thickness. Adjacent to the energy filter 610 may be a thermoelectric layer 320, such as is present in thermoelement 600.

FIGS. 8A-8I show diagrams of a thermoelement 890 in different stages of development. Throughout the figures, there are layers shown with exaggerated relative thicknesses in order to make figures more easily viewable.

Figure 8A:
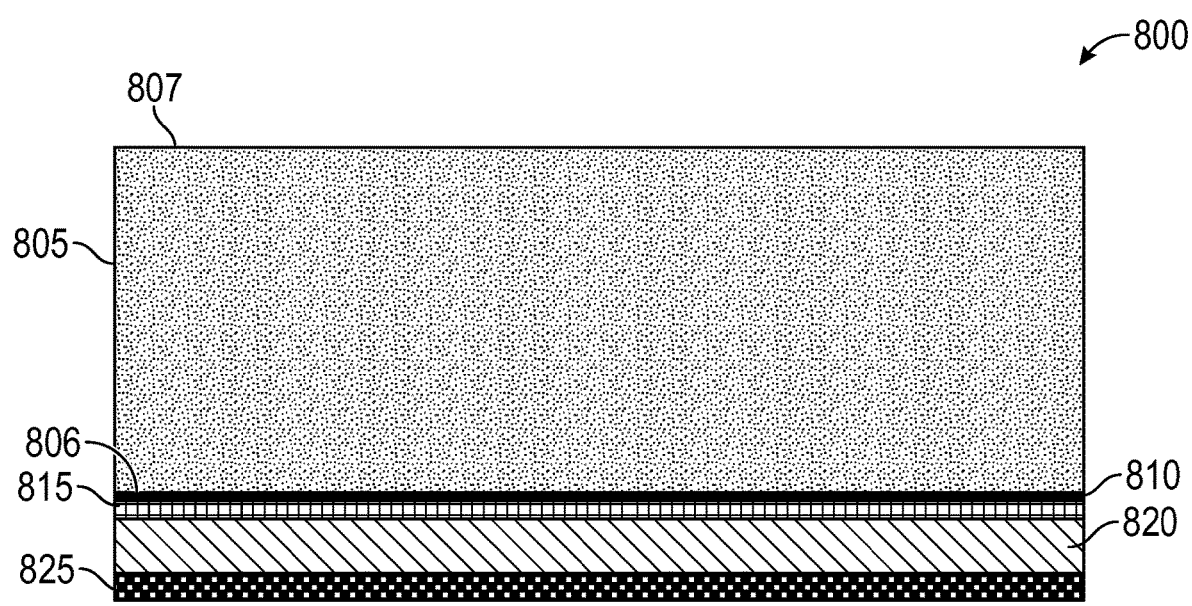
FIG. 8A is a diagram of a base substrate and multi-metal base for a thermoelement according to one embodiment of the present disclosure.

FIG. 8A. shows a diagram of a thermoelement base 800. The base 800 includes substrate 805, which may be thermally and electrically insulating as would be understood by a person of skill in the art. The substrate 805 has a first surface 806 and a second surface 807. The substrate may be a polyimide, liquid crystal polymer (LCPs), parylene, PTFE, polymer aerogels, or a glass, such as silica glass, aluminosilicate glass, and fused-silica glass. In some embodiments, the substrate 805 may be about 10 micrometers to about 1000 micrometers thick. The thermoelement base 800 may have a multiple metal layers deposited proximate to the first surface 806. The multiple metal layers may include an adhesion layer 810, a first gold layer 815, a nickel layer 820, and a second gold layer 825. The adhesion layer 810 may be titanium or titanium-tungsten, or chromium, and adjacent to the first surface 806 of the substrate 805. The adhesion layer 810 may be about 10 nanometers thick. The first gold layer 815 is adjacent to the adhesion layer 810. If the adhesion layer 810 is not present, then the first gold layer 815 may be adjacent to the substrate 805. The first gold layer 815 may be about 400 nanometers thick. The nickel layer 820 is adjacent to the first gold layer 815 and opposite to the adhesion layer 810 or the substrate 805 if the adhesion layer 810 is not present in the embodiment. The nickel layer 820 may be about 5 micrometers thick. In some embodiments, the nickel layer 820 may be electroplated. The second gold layer 825 is adjacent to the nickel layer 820 and opposite to the first gold layer 815. The second gold layer 825 may be about 1 micrometer thick.

Figure 8B:
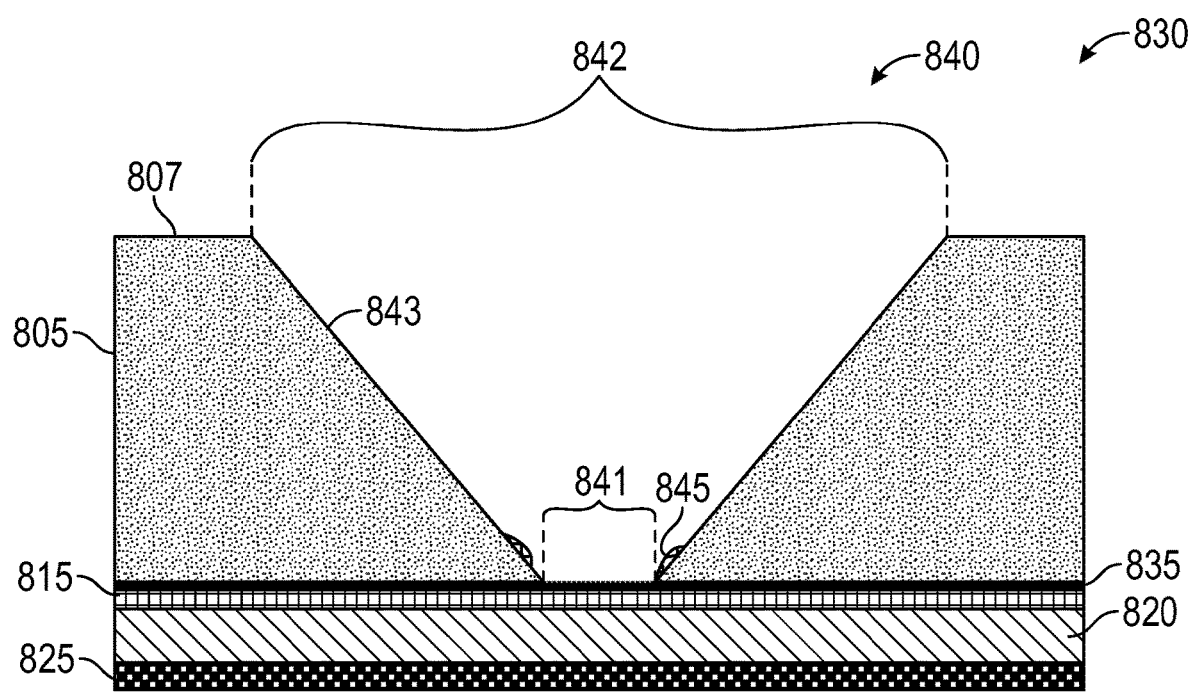
FIG. 8B is a diagram of the base substrate of FIG. 8A after a frustum-shaped section is removed according to one embodiment of the present disclosure.

FIG. 8B shows a diagram of thermoelement base 830, which is the thermoelement base 800 after a frustum-shaped tunnel 840 has been formed in the substrate 805 opposite the adhesion layer 810. The tunnel 840 may be formed by using laser ablation or other subtractive etching techniques known to those of ordinary skill in the art to remove material from the second surface 807. The tunnel 840 may have a narrow opening 841 and a wide opening 842. The narrow opening may be about 40 micrometers in diameter. While the tunnel 840 is shown as frustrum-shaped, this is exemplary and illustrative only, as the tunnel 840 may be cylindrical shaped or an irregular shape. In some embodiments, one or both of the narrow opening 841 and the wide opening 842 may be circular in shape. The wide opening 842 may be about 300 micrometers in diameter. The formation of the tunnel 840 may penetrate the adhesion layer 810 and form an adhesion layer 835 with hole. When the tunnel 840 and adhesion layer 810 are penetrated, some of the first gold layer 815 may be remoted and deposited on the walls 843 of the tunnel 840 as spatter 845.

Figure 8C:
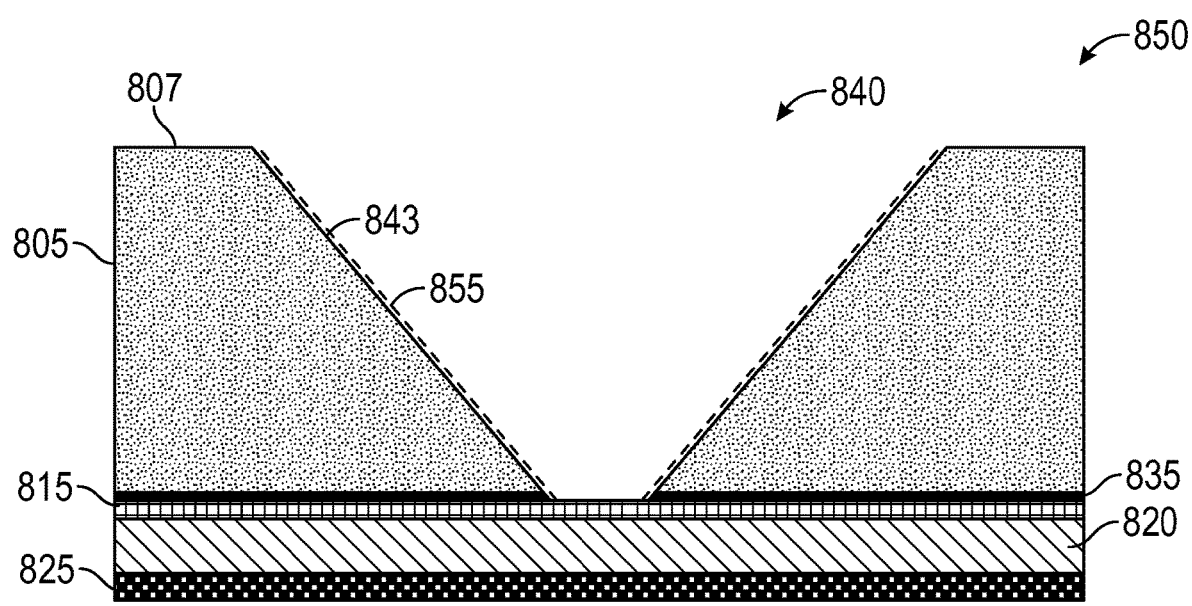
FIG. 8C is a diagram of the base substrate of FIG. 8B after cleaning according to one embodiment of the present disclosure.

FIG. 8C shows a diagram of thermoelement base 850, which is the thermoelement base 830 after the spatter 845 has been removed from the walls 843. In some embodiments, the spatter 845 may be removed using potassium iodide. The walls 843 may be made hydrophilic using $O_2$ and $CF_4$ plasma.

Figure 8D:
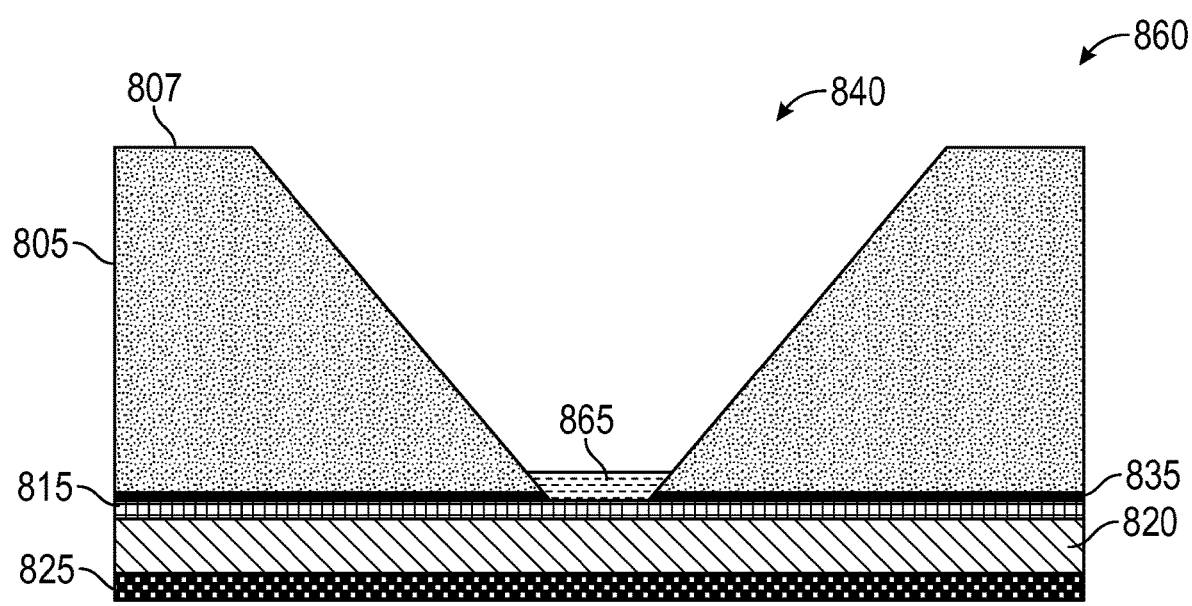
FIG. 8D is a diagram of the base substrate of FIG. 8C with a barrier layer according to one embodiment of the present disclosure.

FIG. 8D shows a diagram of a thermoelement base 860, which is the thermoelement base 850 after a barrier layer 865 has been deposited at the bottom of the tunnel 840. The barrier layer 865 may be about 5 micrometers thick. The barrier layer 865 may be made of one or more materials selected to resist diffusion into a thermoelectric layer 875 (see FIG. 8E) that is disposed in the tunnel 840 and adjacent to the barrier layer 865. The barrier layer 865 may conform to shape of the tunnel 840. The barrier layer 865 may be made of one or more of: rhodium, platinum, iridium, tantalum/tantalum nitride, titanium/titanium nitride, chromium, or cobalt.

Figure 8E:
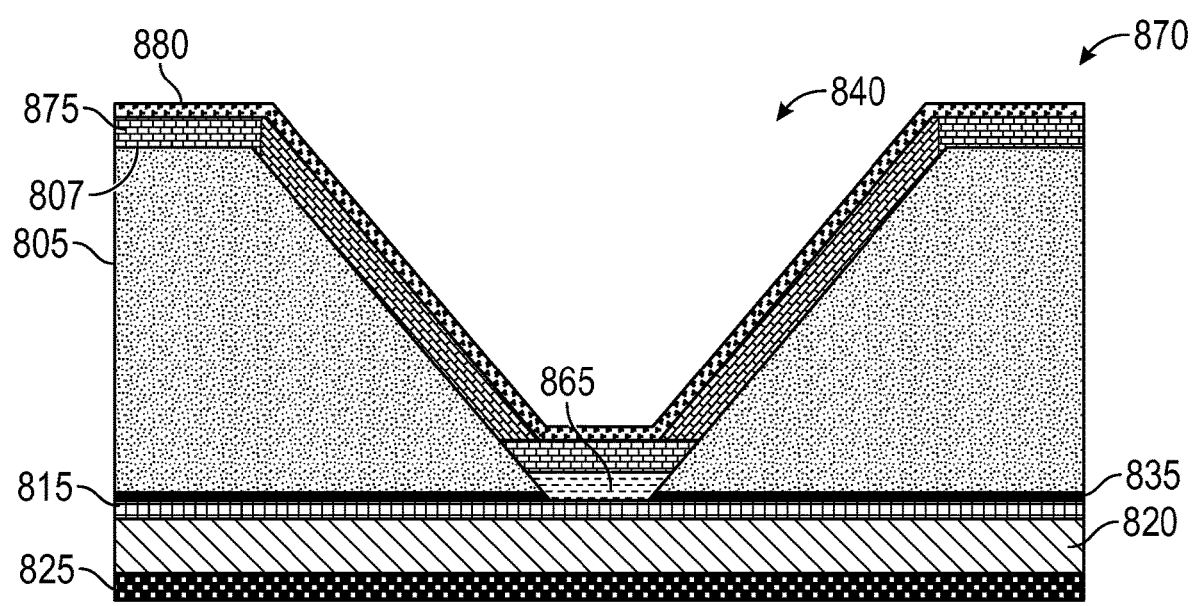
FIG. 8E is a diagram of the base substrate of FIG. 8D with a thermoelectric layer and metal layer added according to one embodiment of the present disclosure.

FIG. 8E shows a diagram of a thermoelement 870, which includes the thermoelement base 860 after a thermoelectric layer 875 and a metal layer 880 have been deposited in the tunnel 840. The thermoelectric layer 875 between the metal layer 880 and the barrier layer 865 and between the metal layer 880 and the substrate 805 depending on location within the thermoelement 870. The thermoelectric layer 875 and the metal layer 880 may conform to the shape of the walls 843 of the tunnel 840.

Figure 8F:
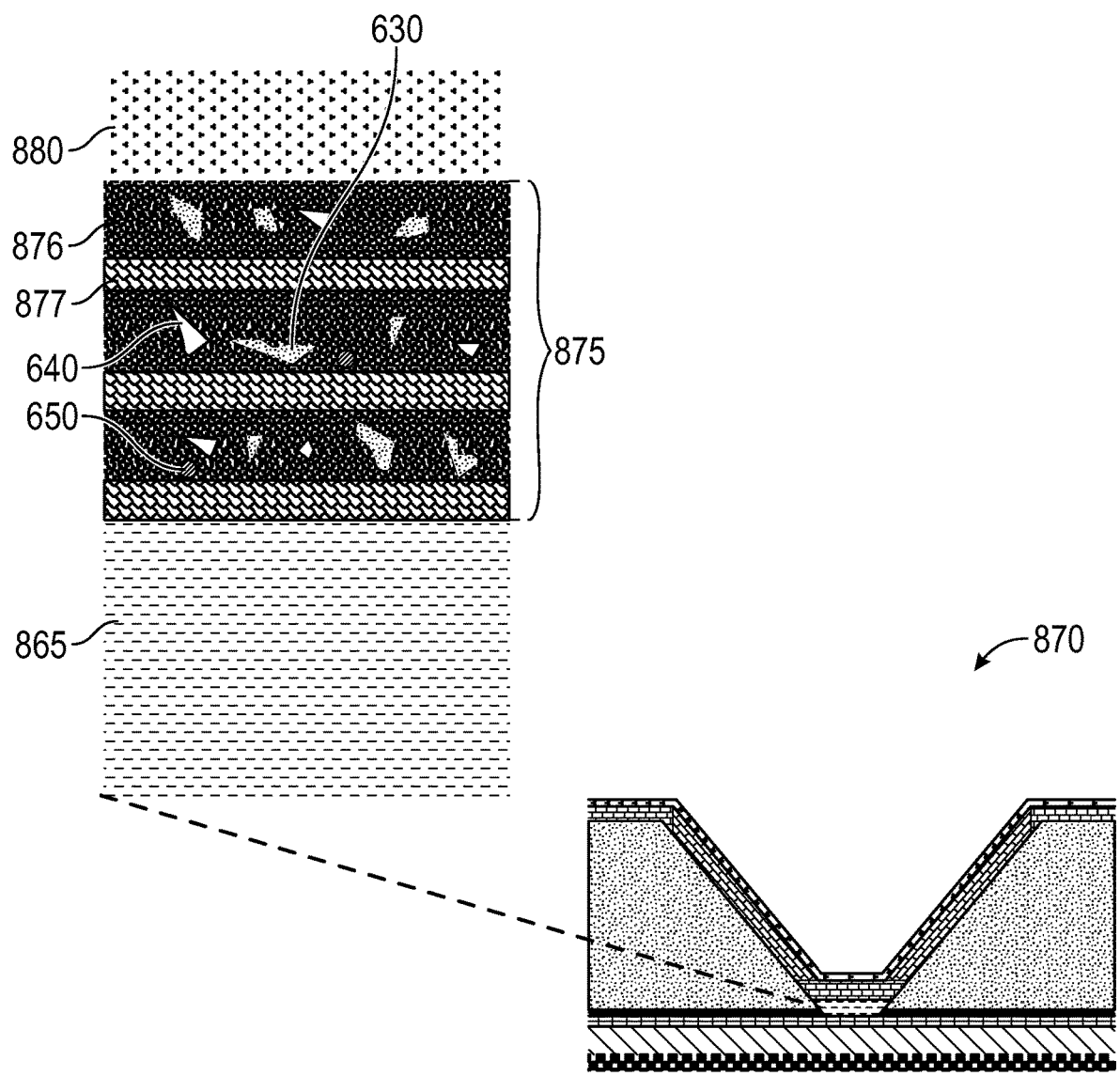
FIG. 8F is a diagram of a magnified portion of the thermoelectric layer with alternating layers according to one embodiment of FIG. 8E.

FIG. 8F shows a magnified section of the thermoelement 870 of FIG. 8E to provide detail regarding the thermoelectric layer 875. The thermoelectric layer 875 may be made of a single material or alternating composite thermoelectric layers 876 and interlayers 877 (as shown here), with the initial composite thermoelectric layer proximate to the barrier layer 865 or substrate 805. The composite thermoelectric layers 876 may be made of n-type or p-type material. In some embodiments, n-type materials may include one or more of: Bi—Te—Se, SiGe—P, Mg$_3$Bi$_2$, Mg—Sb—Bi—Te, InSb, BiSb, PbSe, SnSSe, Half-Heusler alloys, full Heusler alloys, Fe—V—W—Al, Yb—Ba—Co—Sb, La—Te, Pr—Te, SiGe—C, and YbAl. In some embodiments, p-type materials may include one or more of: BiSb—Te, SiGe—B, Zintl compounds, Yb—Mn—Sb, Ce—Fe—Co—Sb, CePd, CsBiTe, PbTe, and ZnSb. In some embodiments, n-type or p-type composite thermoelectric layers 876 may be formed by annealing two different materials in a specific ratio, such as Bi$_2$Te and Bi$_2$Se in a 9:1 ratio to form Bi$_2$Te$_{2.7}$Se$_{0.3}$. In some embodiments, the composite thermoelectric layers 876 may be about 5 to about 500 nanometers in thickness. The composite thermoelectric layers 876 may be the same or similar in structure to the composite thermoelectric layers 330. As with the composite thermoelectric layers 330, the composite thermoelectric layers 876 may include grains 630 that may form during annealing (at about 350 degrees C.). The sizes of the grains 630 may be controlled by altering one or more of: the time of annealing, the temperature of annealing, and spacing of the interlayers 877 relative to the composite thermoelectric layers 876. The composite thermoelectric layers 876 may also include voids 640 that may be formed during a quenching step that takes place after annealing to cool down the composite thermoelectric layers 876. The sizes of the voids 640 may be controlled by altering one or more of: the time of annealing, the temperature of annealing, and spacing of the interlayers 877 relative to the composite thermoelectric layers 876. The grains 630 and the voids 640 may reduce the thermal conductance in the composite thermoelectric layers 876. In some embodiments, an optional dopant 650 may be added, such as, but not limited to, gold or Ag or Pt or Ir. In some embodiments, the dopant 650 may be about 1 nanometer in diameter and diffused throughout the composite thermoelectric layer 876 during annealing.

The interlayers 877 are selected for their phonon blocking properties. In some embodiments, the interlayers 877 may be made of one of: TiW, gold, iridium, platinum, tungsten, molybdenum, and InSb. In some embodiments, the interlayers 877 may be about 1 to about 10 nanometers thick. A metal layer 880 may be deposed on the thermoelectric layer 875.

Figure 8G:
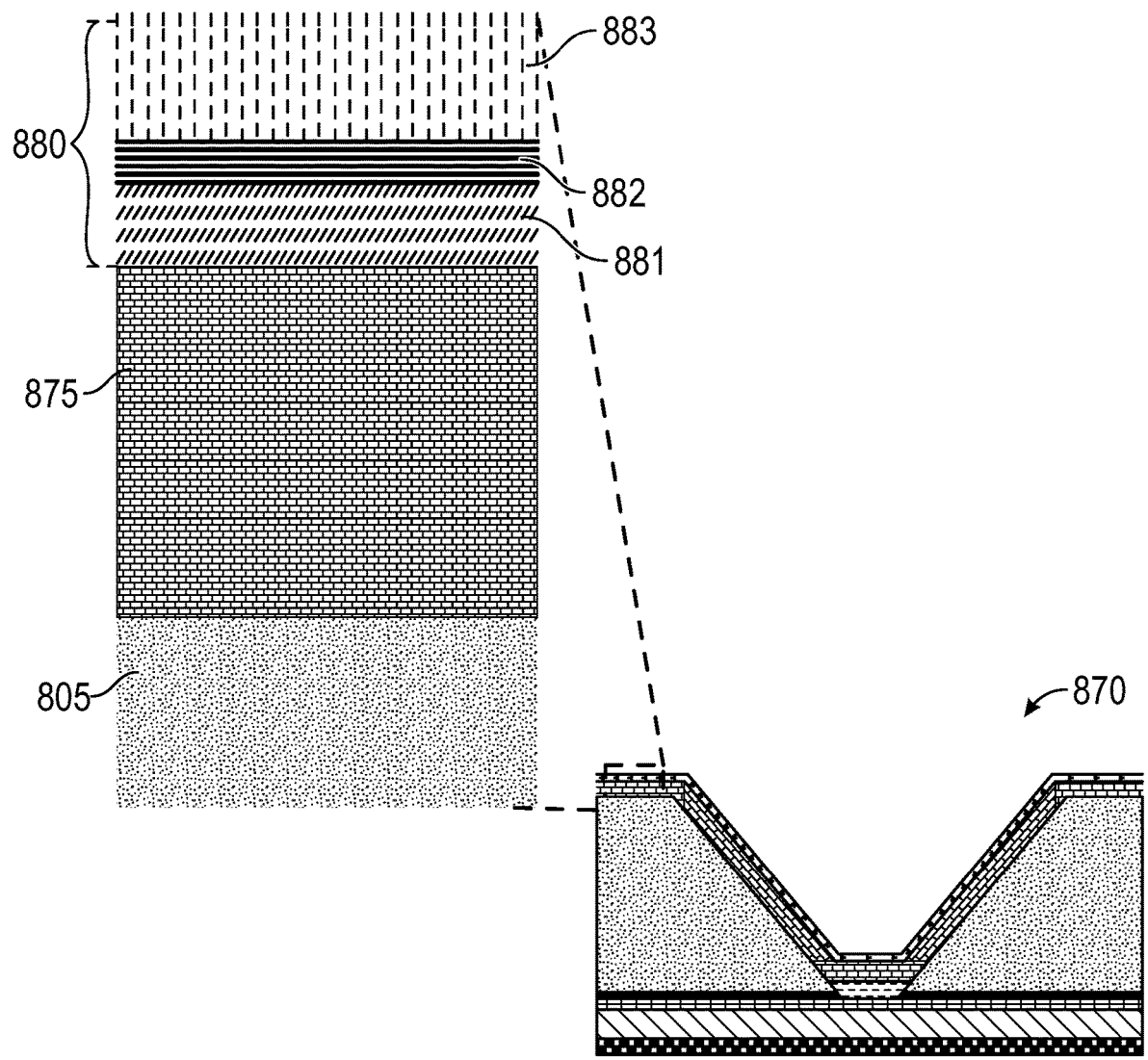
FIG. 8G is a diagram of a magnified portion of the metal layer with multiple sublayers according to one embodiment of FIG. 8E.

FIG. 8G shows a magnified section of the thermoelement 870 of FIG. 8E to provide detail regarding the metal layer 880. While the metal layer 880 may be homogeneous, such as a uniform layer of platinum or it may also contain sublayers as shown here. The metal layer 880 may be about 100 to about 3000 nanometers thick. The metal layer 880 may be of a uniform thickness that conforms to the shape of the walls 843. As shown, the metal layer 880 has a first layer 881, a second layer 882, and a third layer 883. The first layer 881 is proximate to the thermoelectric layer 875, the third layer 883 is distal to the thermoelectric layer 875, and the second layer 882 is between the first layer 881 and the third layer 883. The first layer 881 may be made of one of: platinum, nickel, TiW, Ta—TaN, titanium, cobalt, iridium, and rhodium. The first layer 881 may be about 50 to about 500 nanometers thick. The second layer 882 may be made of one of: platinum, cobalt and nickel. The second layer 882 may be about 1 to about 2 micrometers thick. The third layer 883 may be made of one of: platinum, gold, or silver. The third layer 883 may be about 10 to about 1000 nanometers thick. In some embodiments, the metal layer 880 may contain more or fewer than three sublayers.

Figure 8H:
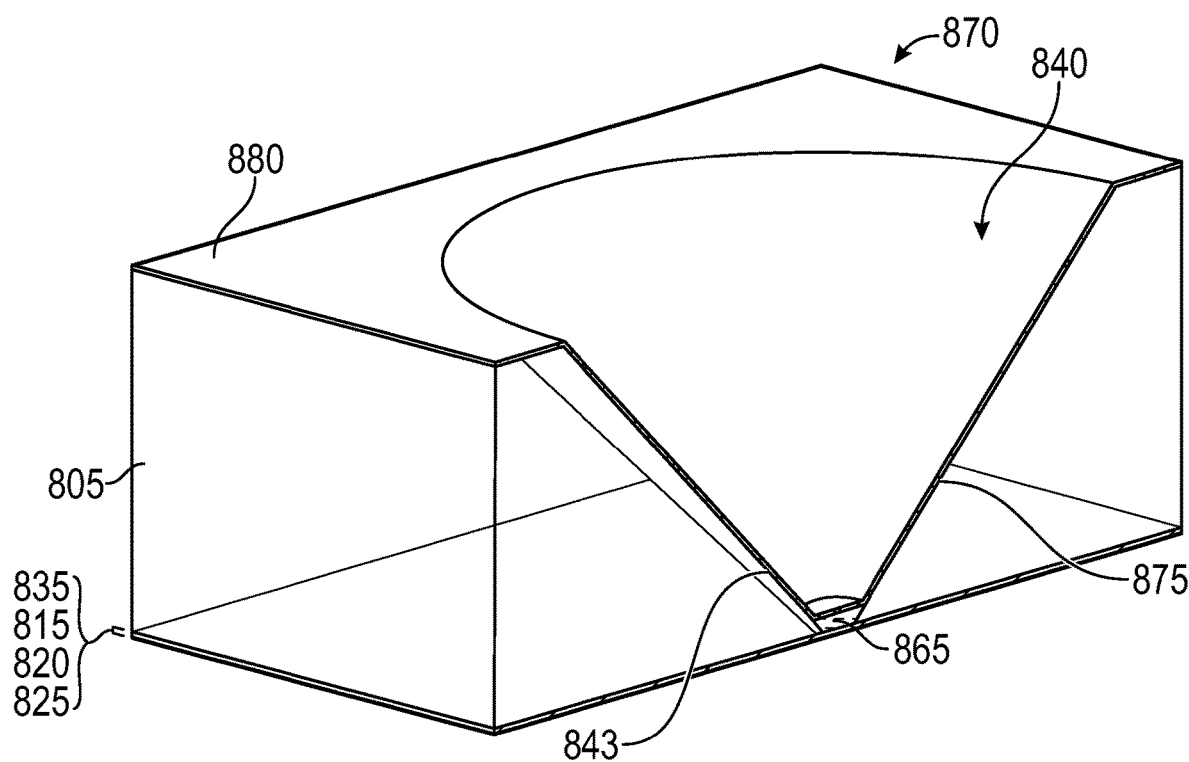
FIG. 8H is a diagram of a 3-D cross-section of FIG. 8E.

FIG. 8H shows a 3-D cross-section of the thermoelement 870. The tunnel 840 with the thermoelectric layer 875 and the metal layer 880 deposed on top of the walls 843 is shown with its frustum shape retained. While a frustum shape is shown, other shapes of the tunnel 840 with different contours of the walls 843 may be used and retained after the addition of the thermoelectric layer 875 and the metal layer 880.

Figure 8I:
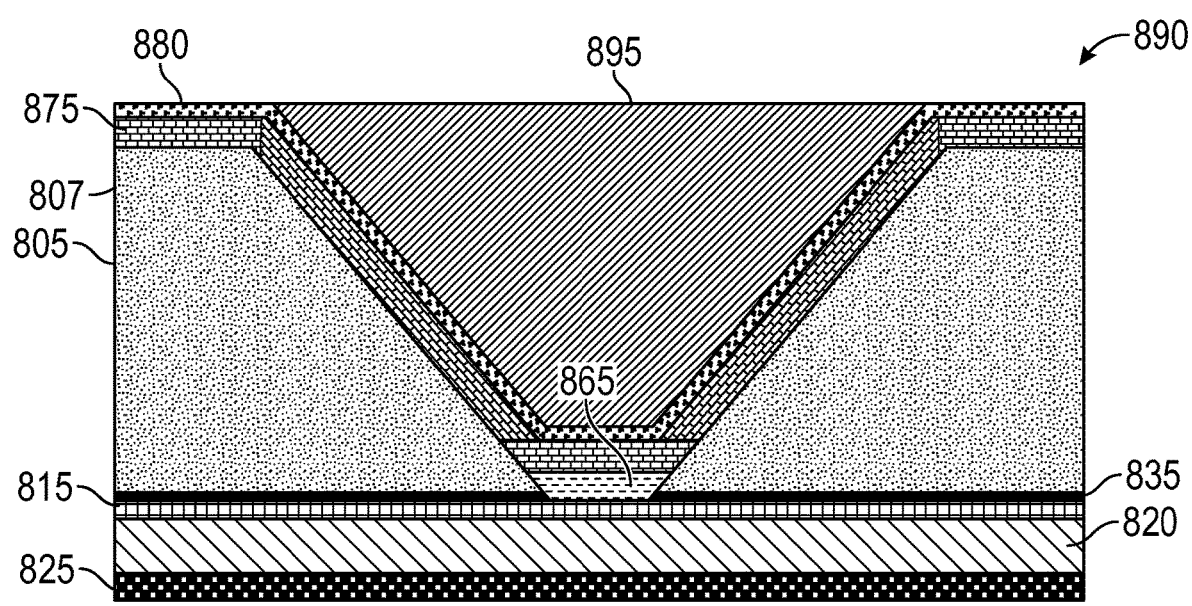
FIG. 8I is a diagram of a thermoelement from formed after adding a cap layer to the embodiment of FIG. 8E.

FIG. 8I shows a diagram of a thermoelement 890, which includes the thermoelement 870 after the tunnel 840 has been filled in with a cap layer 895. The cap layer 895 may be composed of sintered nano-silver or solder, such as BiSn or SnAgCu or AuSn.

Figure 9:
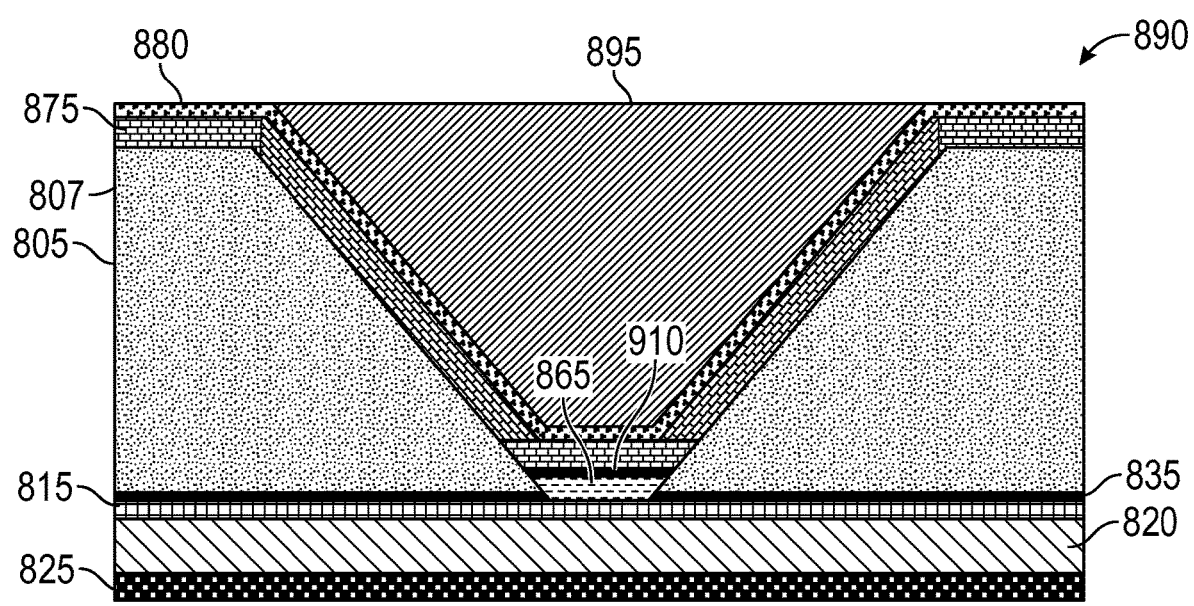
FIG. 9 is a diagram of another thermoelement with an energy filter layer according to another embodiment of the present disclosure.

FIG. 9 shows a diagram of a thermoelement 900 according to another embodiment of the present disclosure. The thermoelement 900 has all the components of the thermoelement 890 and includes an additional energy filter layer 910 disposed between the thermoelectric layer 875 and the barrier layer 865. The energy filter layer 910 may be only a single layer or few layers of atoms in thickness. The energy filter layer 910 may be configured to block the movement of low energy electrons or holes. The energy filter layer 910 is selected to increase the Seebeck coefficient of the thermoelement 900. In some embodiments, the energy filter layer 910 may be made of two-dimensional electron gas (2DEG) structures, twisted layers of graphene, layers of hexagonal boron nitride (HBN) and graphene, silicene, phosphene, or SiTe.

In operation, the temperatures of electrons and phonons depend on the intensity of electron-phonon interactions within the composite thermoelectric layers 876. The thermal conductivity of the thermoelement 890, 900 is dependent on the ratio of the thickness t of the composite thermoelectric layers 876 to the thermalization length $\Lambda$, and the electron/phonon thermal conductivities, $\lambda_e$ and $\lambda_p$ respectively:

$$\lambda = \frac{\lambda_e(\lambda_e + \lambda_p)}{\lambda_e + \lambda_e[\tanh(t/\Lambda)/(t/\Lambda)]}.$$

Note that $\lambda \to \lambda_e$ for $t \ll \Lambda$. For example, the characteristic thermalization lengths $\Lambda$ for Bi—Sb—Te and the Bi—Te—Se systems are in the range 500-700 nm. The thermoelement 890, 900 has a thickness $t \sim 200$-400 nm of the composite layers 876, and the phonon-glass-electron-crystal limit with the figure-of-merit $$ZT = \frac{S^2 \sigma T}{\lambda} \rightarrow \frac{S^2 \sigma T}{\lambda_e} = S^2/L_{0t},$$

$L_{0t}$ being the Lorentz number for the material system (for p-type materials, $\sqrt{L_{0t}}$=130 µV/K). Hence, with typical Seebeck coefficient S in the range 200-240 µV/K, ZT>3. The parasitic thermal conduction, fill-factor ratio, and electrical interface losses may lower the performance of structure to ZT ~2. By further adding energy filters 910, emission properties at the controlled at the interface and high entropy electrons selected. Using energy filters with graphene structures twisted with special magic angles and emission effects (similar to the Bénard-Rayleigh convection), the Seebeck coefficients S>($\pi k_B$)/e=270 µV/K for the thermoelement 900. This indicates that ZT=$S^2/L_{0t}$~4.

Figure 10:
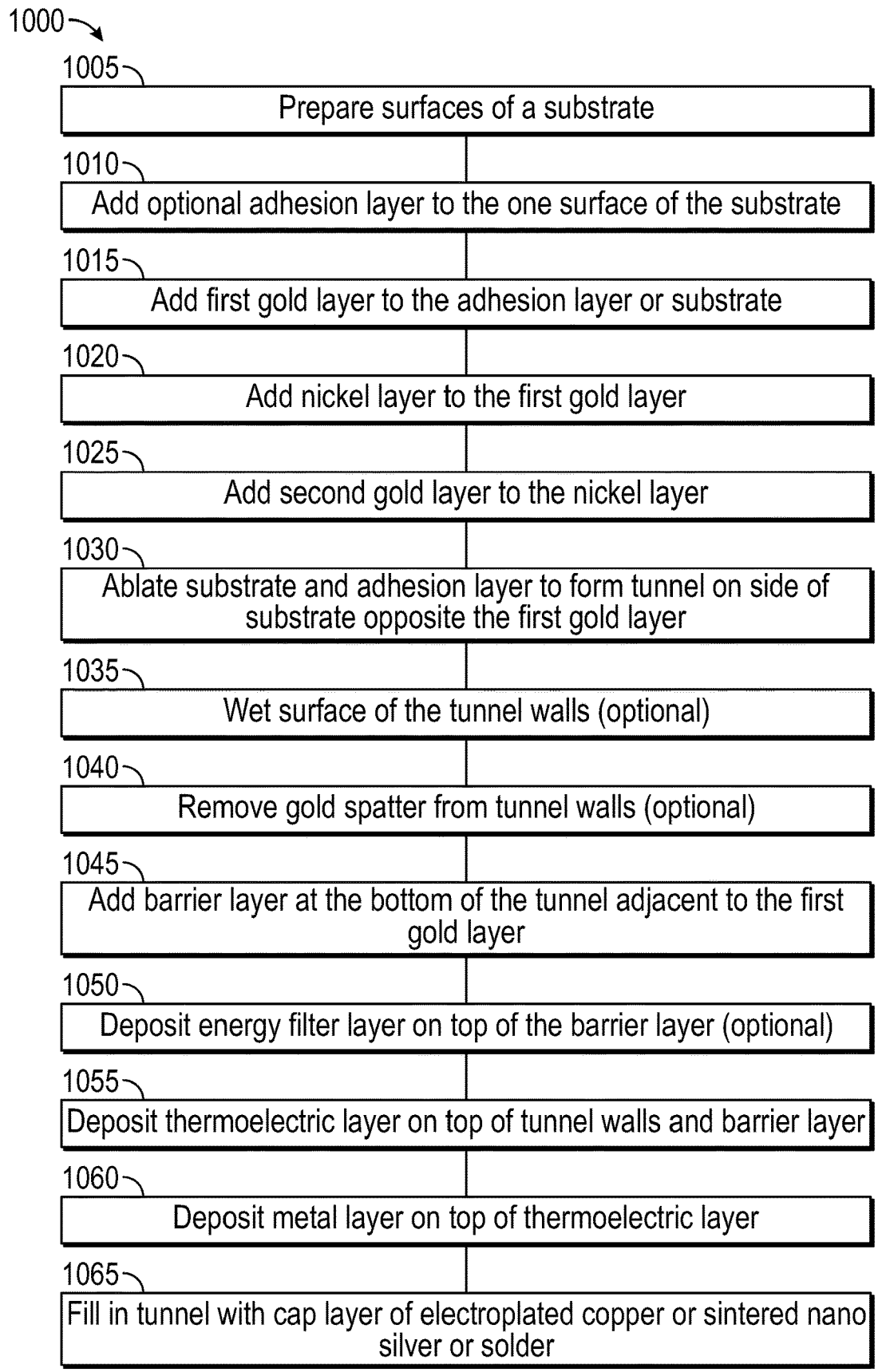
FIG. 10 is a flow chart of a method for forming a thermoelement according to one embodiment of the present disclosure.

FIG. 10 shows a flow chart of a method 1000 for making a thermoelement 890, 900, 1000. In step 1005, the substrate 805 is prepared. The preparation may include washing the surfaces of the substrate 805 with an aqueous solution of potassium hydroxide or sodium hydroxide. The substrate 805 may be heated to 45 degrees Celsius before or during the cleaning. In some embodiments, the substrate 805 may be further cleaned with deionized water. The substrate 805 may be then heated to about 150 degrees Celsius for about 2 hours to drive residual moisture out of the substrate 805.

In step 1010, the optional adhesion layer 810 may be added to one surface of the substrate 805. The adhesion layer 810 may be applied to a thickness of about 10 nanometers. The adhesion layer 810 may be added using physical vapor deposition (PVD) such as sputtering or thermal evaporation. In step 1015, the first gold layer 815 may be deposited on the adhesion layer 810 or directly to the surface of the substrate 805 if the adhesion layer 810 is not present. The first gold layer 815 may be applied through PVD or other suitable technique known to a person of skill in the art. The first gold layer 815 may be applied to a thickness of about 400 nanometers. In step 1020, the nickel layer 820 may be deposited on the first gold layer 815. The nickel layer 820 may be applied through electroplating or other suitable technique known to a person of skill in the art. The nickel layer 820 may be applied to a thickness of about 5 micrometers. In step 1025, the second gold layer 825 may be deposited on the nickel layer 820. The second gold layer 825 may be applied through electroplating or other suitable technique known to a person of skill in the art. The second gold layer 825 may be applied to a thickness of about 1 micrometer.

In step 1030, the side of the substrate 805 opposite the first gold layer 815 may be removed to form the tunnel 840. The tunnel 840 may be cylindrical, frustum, or irregular in shape. The removal process may include laser ablation of some of the substrate 805 and some of the adhesion layer 810. In some instances, some of the first gold layer 815 may be ablated as well. If some of the first gold layer 815 is ablated, this may result in spatters 845 of material on the walls 843 of the tunnel 840. In step 1035, the walls 843 may be wetted. The wetting process may include using carbon tetrafluoride and oxygen plasma to create a thin layer of oxide (wetted layer 855) on top of the substrate 805 on the walls 843. In step 1040, the spatters 845 may be removed using micro etching. In some embodiments, the micro etching is performed by applying potassium iodide to clean the walls 843.

In step 1045, the barrier layer 865 may be deposited at the bottom of the tunnel 840 and adjacent to the first gold layer 815. The barrier layer 865 may be applied using electroplating or using physical vapor deposition (PVD) such as sputtering or thermal evaporation. The barrier layer 865 may be applied to a thickness of about 5 micrometers. The material applied to form the barrier layer 865 may include one or more of: rhodium, platinum, iridium, tantalum/tantalum nitride, titanium/titanium nitride, chromium, or cobalt. In step 1050, an optional energy filter layer 910 may be deposited on the barrier layer 865. The energy filter layer 910 may only be a few atoms thick. The energy filter layer 910 may be made of two-dimensional electron gas (2DEG) structures, twisted layers of graphene, layers of hexagonal boron nitride (HBN) and graphene, silicene, phosphene, or SiTe.

In step 1055, the thermoelectric layer 875 may be deposited on the walls 843, the second surface 807 of the substrate 805, and the energy filter layer 910 (or the barrier layer 865, if the energy filter layer 910 is not present). The thermoelectric layer 875 may be deposited as one uniform layer or as a plurality of alternating layers made up of composite thermoelectric layers 876 and interlayers 877. The thermoelectric layer 875 or its sublayers 876, 877 may be deposited using physical vapor deposition (PVD) such as sputtering or thermal evaporation or chemical vapor deposition (CVD) or Atomic Layer Deposition (ALD) or electroplating.

In step 1060, the metal layer 880 may be deposited on the thermoelectric layer 875. The metal layer 880 may be deposited as one uniform layer or as a plurality of layers, such as 881, 882, 883. The metal layer 880 may be deposited using physical vapor deposition (PVD) such as sputtering or thermal evaporation or electroplating. Where the metal layer 880 has the first layer 881, the second layer 882, and the third layer 883, then the first layer 881 may be deposited on the thermoelectric layer 875, the second layer 882 deposited on the first layer 881, and the third layer 883 deposited on the second layer 882. The first layer 881 may be made of one of: platinum, nickel, TiW, Ta—TaN, titanium, cobalt, iridium, and rhodium. The first layer 881 may be about 50 to about 500 nanometers thick. The second layer 882 may be made of one of: platinum, cobalt and nickel. The second layer 882 may be about 1 to about 2 micrometers thick. The third layer 883 may be made of one of: platinum, gold, and silver. The third layer 883 may be about 10 to about 1000 nanometers thick. In some embodiments, the metal layer 880 may contain more or fewer than three sublayers. In step 1065, a cap layer 895 may be deposited in the tunnel 840 adjacent to the metal layer 880. The cap layer 895 may fill in the tunnel 840 and be flush with the second surface 807 or restore the thermoelement 890, 900 to the original thickness of the thermoelectric base 800. The cap layer 895 may be composed of sintered nano-silver or solder, such as BiSn or SnAgCu or AuSn.

FIGS. 11A-F show diagrams of a thermoelectric device 1105 in different stages of development. Throughout the figures, there are layer shown with exaggerated relative thicknesses in order to make figures more easily viewable.

Figure 11A:
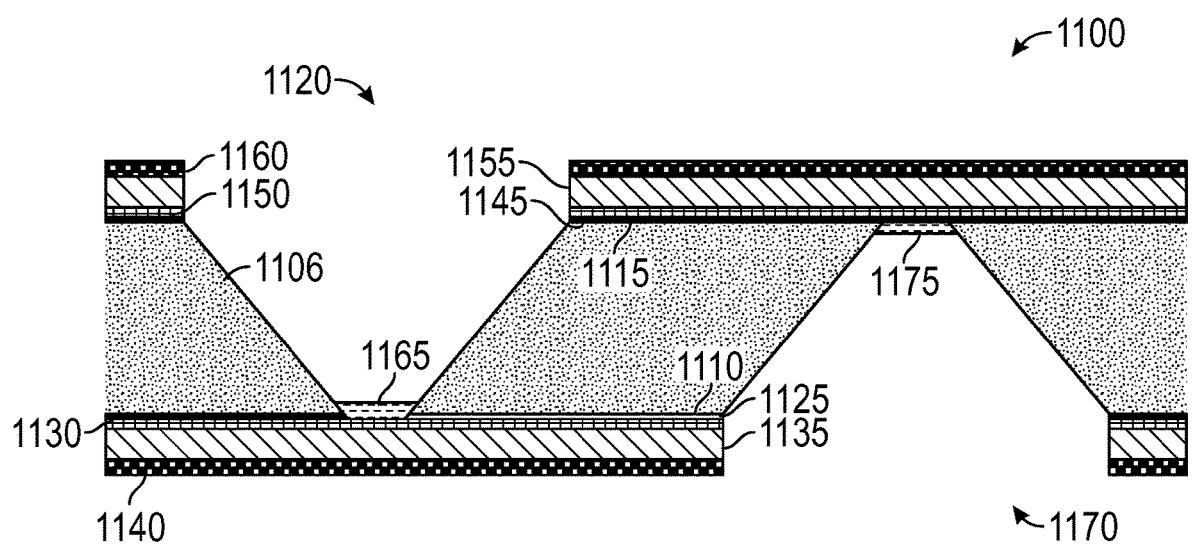
FIG. 11A is a diagram of a thermoelectric device base with tunnels and multi-metal bases on both surfaces according to one embodiment of the present disclosure.

FIG. 11A. shows a diagram of a thermoelectric device base 1100. The base 1100 includes substrate 1106, which may be thermally and electrically insulating as would be understood by a person of skill in the art. The substrate 1106 has a first surface 1110 and a second surface 1115. The substrate may be a polyimide, liquid crystal polymer (LCPs), parylene, PTFE, polymer aerogels, or a glass, such as silica glass, aluminosilicate glass, and fused-silica glass. In some embodiments, the substrate 1106 may be about 10 micrometers to about 4000 micrometers thick. The thermoelement base 1100 may have a multiple metal layers deposited proximate to the first surface 1110 and the second surface 1115. The multiple metal layers on the first surface 1110 may include an adhesion layer 1125, a first gold layer 1130, a nickel layer 1135, and a second gold layer 1140. The adhesion layer 1125 may be titanium or titanium-tungsten, or chromium, and adjacent to the first surface 1110 of the substrate 1106. The adhesion layer 1125 may be about 10 nanometers thick. The first gold layer 1130 is adjacent to the adhesion layer 1125. If the adhesion layer 1125 is not present, then the first gold layer 1130 may be adjacent to the substrate 1106. The first gold layer 1130 may be about 400 nanometers thick. The nickel layer 1135 is adjacent to the first gold layer 1130 and opposite to the adhesion layer 1125 or the substrate 1106 if the adhesion layer 1125 is not present in the embodiment. The nickel layer 1135 may be about 5 micrometers thick. In some embodiments, the nickel layer 1135 may be electroplated. The second gold layer 1140 is adjacent to the nickel layer 1135 and opposite to the first gold layer 1130. The second gold layer 1140 may be about 1 micrometer thick. The multiple metal layers on the second surface 1115 may be structured the same as the layers on the first surface 1110. Thus, there may be an adhesion layer 1145, a first gold layer 1150, a nickel layer 1155, and a second gold layer 1160. The adhesion layer 1145 may be titanium or titanium-tungsten, or chromium, and adjacent to the first surface 1110 of the substrate 1106. The adhesion layer 1145 may be about 10 nanometers thick. The first gold layer 1150 is adjacent to the adhesion layer 1145. If the adhesion layer 1145 is not present, then the first gold layer 1150 may be adjacent to the substrate 1106. The first gold layer 1150 may be about 400 nanometers thick. The nickel layer 1155 is adjacent to the first gold layer 1150 and opposite to the adhesion layer 1145 or the substrate 1106 if the adhesion layer 1145 is not present in the embodiment. The nickel layer 1155 may be about 5 micrometers thick. In some embodiments, the nickel layer 1155 may be electroplated. The second gold layer 1160 is adjacent to the nickel layer 1155 and opposite to the first gold layer 1150. The second gold layer 1160 may be about 1 micrometer thick. At the second surface 1115, portions the metal layers 1145, 1150, 1155 1160, 1125, and the substrate 1106 may be removed to form a tunnel 1120. Similarly, at the first surface 1110, portions of the metal layers 1125, 1130, 1135, 1140, 1145 and the substrate 1106 may be removed or absent to form a tunnel 1170. The tunnels 1120, 1170 may be similarly formed, shaped, and dimensioned as the tunnel 140. A first barrier layer 1165 may be disposed in the tunnel 1120 on the first gold layer 1130 proximate to the first surface 1110, and second barrier layer 1175 may be disposed in the tunnel 1170 on the first gold layer 1150 proximate to the second surface 1115. The barrier layers 1165, 1175 may be made of one or more materials selected to resist diffusion into a thermoelectric layer 1180, 1185 (see FIGS. 11B, 11C). The barrier layers 1165, 1175 may conform to shapes of the tunnels 1120, 1170. The barrier layer 1165, 1175 may be made of one or more of: rhodium, platinum, iridium, tantalum/ tantalum nitride, titanium/titanium nitride, chromium, or cobalt. The barrier layers 1165, 1175 may be about 5 micrometers thick.

Figure 11B:
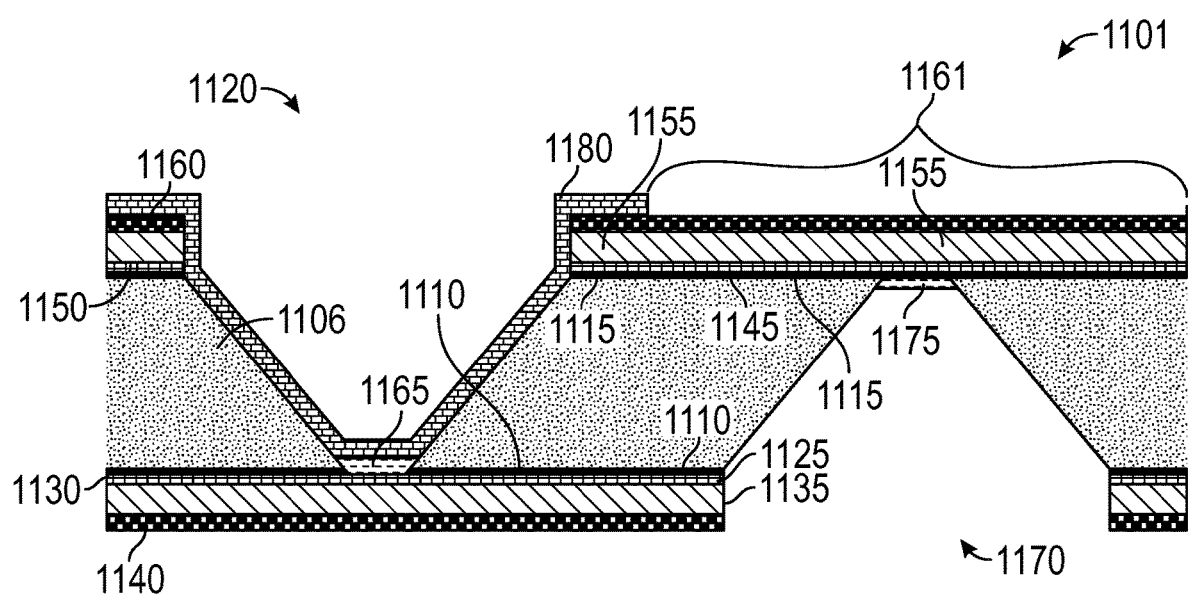
FIG. 11B is a diagram of the thermoelectric device base of FIG. 11A with thermoelectric material deposited on one surface according to one embodiment of the present disclosure.

FIG. 11B shows a diagram a thermoelectric device 1101, which is the thermoelectric device base 1100 after a n-type thermoelectric layer 1180 has been disposed on the second gold layer 1160 proximate to the second surface 1115, the barrier layer 1165, and the substrate 1106 within the tunnel 1120. The n-type thermoelectric layer 1180 may be proximate to the sides of the opening of the tunnel 1120 at the second surface 1115 leaving a portion 1161 of the second gold layer 1160 uncovered. The n-type thermoelectric layer 1180 may be deposited using by masking or patterning to create the uncovered portion 1161. The n-type thermoelectric layer 1180 may be made of the same materials as the n-type version of the thermoelectric layer 175. The thermoelectric layer 1180 may be made of a single material or alternating composite thermoelectric layers 876 and interlayers 877 (as shown in FIG. 1F), with the initial composite thermoelectric layer proximate to the barrier layer 1165 or substrate 1106.

Figure 11C:
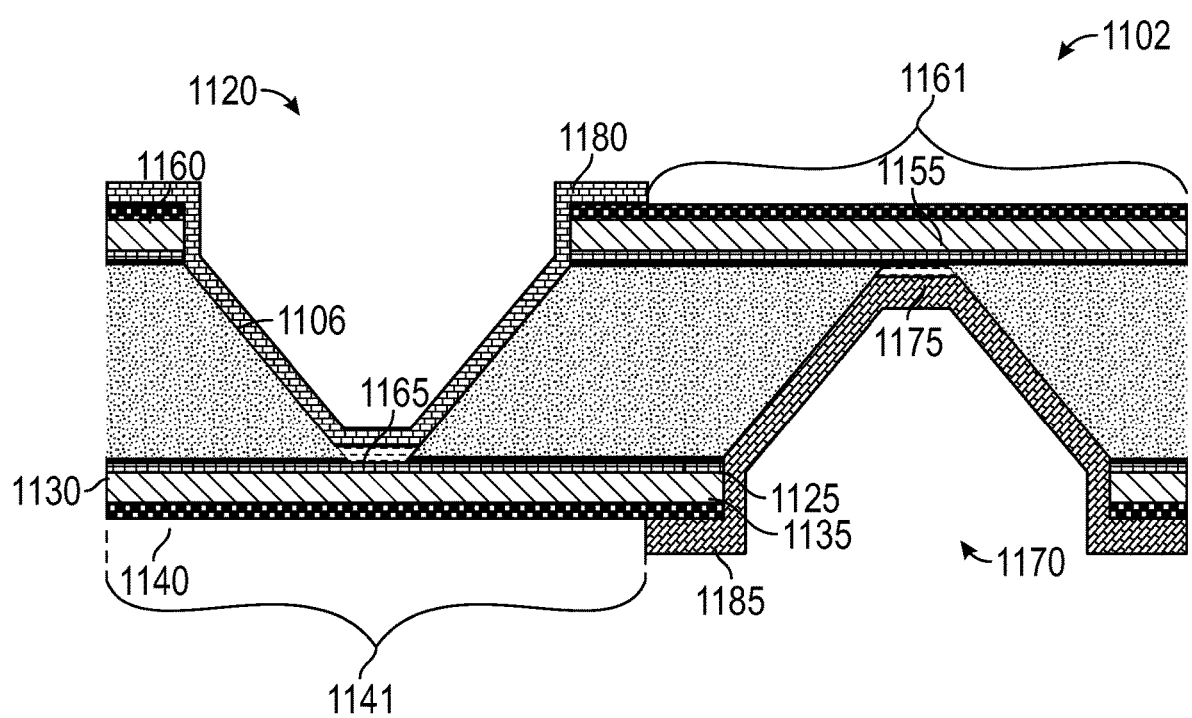
FIG. 11C is a diagram of the thermoelectric device base of FIG. 11B with thermoelectric material deposited on both surfaces according to one embodiment of the present disclosure.

FIG. 11C shows a diagram a thermoelectric device 1102, which is the thermoelectric device 1101 after an p-type thermoelectric layer 1185 has been disposed on the second gold layer 1140 proximate to the first surface 1110, the barrier layer 1175, and the substrate 1106 within the tunnel 1170. The p-type thermoelectric layer 1185 may be proximate to the sides of the opening of the tunnel 1170 at the first surface 1110 leaving a portion 1141 of the first gold layer 1140 uncovered. The p-type thermoelectric layer 1185 may be deposited using by masking or patterning to create the uncovered portion 1141. The p-type thermoelectric layer 1185 may be made of the same materials as the p-type version of the thermoelectric layer 875. The thermoelectric layer 1185 may be made of a single material or alternating composite thermoelectric layers 876 and interlayers 877 (as shown in FIG. 8F), with the initial composite thermoelectric layer proximate to the barrier layer 1175 or substrate 1106.

Figure 11D:
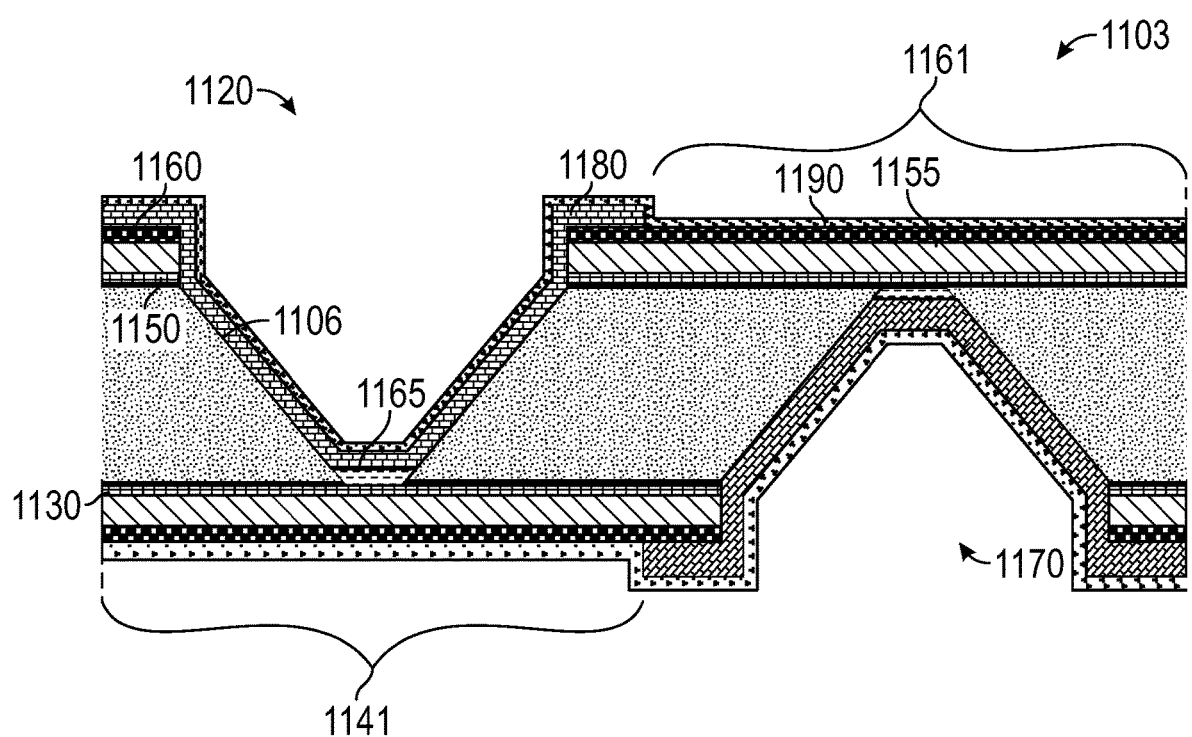
FIG. 11D is a diagram of the thermoelectric device base of FIG. 11C with metal layers deposited on both thermoelectric layers according to one embodiment of the present disclosure.

FIG. 11D shows a diagram of a thermoelectric device 1103, which includes the thermoelectric device 1102 after a metal layer 1190 is disposed on the thermoelectric layer 1180, where present, and on the second gold layer 1160 in the uncovered portion 1161. Likewise, a metal layer 1195 is disposed on the thermoelectric layer 1185, where present, and on the first gold layer 1140 in the uncovered portion 1141. The metal layers 1190, 1195 may be homogeneous, such as a uniform layer of platinum, or may contain sublayers similar to or the same as the sublayers 881, 882, 883 in structure, thickness, and composition. The metal layers 1190, 1195 may be about 400 to about 3000 nanometers thick. In some embodiments, the metal layer 1190 may contain more or fewer than three sublayers.

Figure 11E:
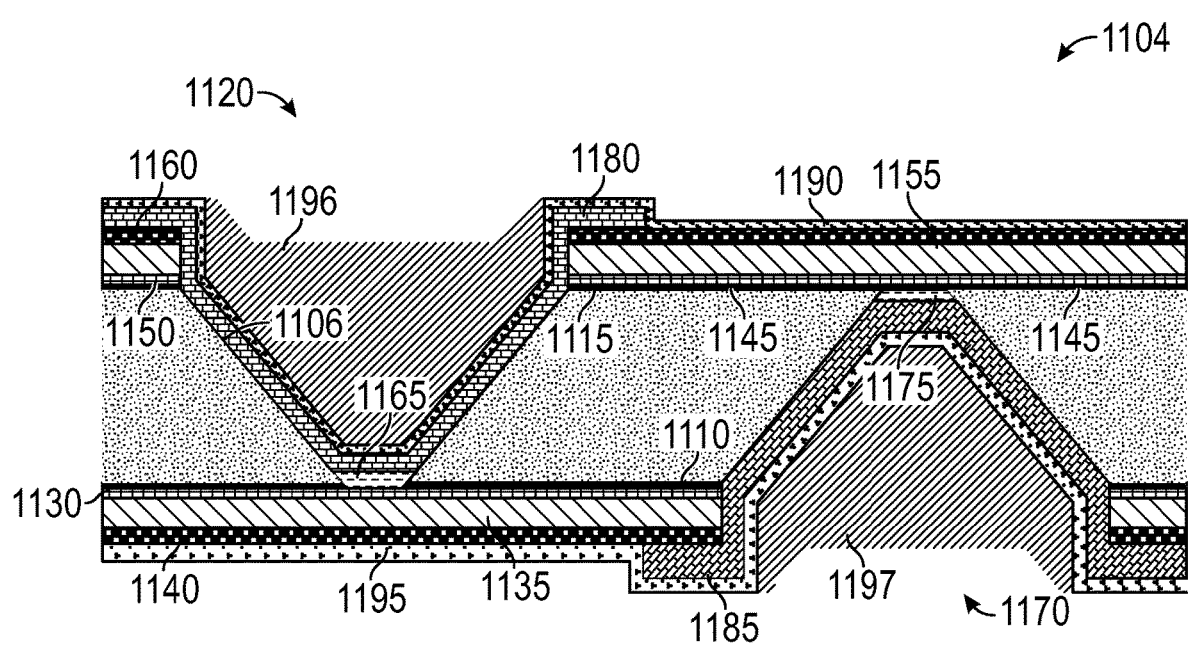
FIG. 11E is a diagram of the thermoelectric device of FIG. 11D with the tunnels filled according to one embodiment of the present disclosure.

FIG. 11E shows a diagram of a thermoelectric device 1104, which includes the thermoelectric device 1103 after the tunnels 1120, 1170 have been at least partially filled with cap layers 1196, 1197. The cap layers 1196, 1197 may be composed of sintered nano-silver or solder, such as BiSn or SnAgCu or AuSn or electroplated metals like copper, nickel, platinum, gold or silver.

Figure 11F:
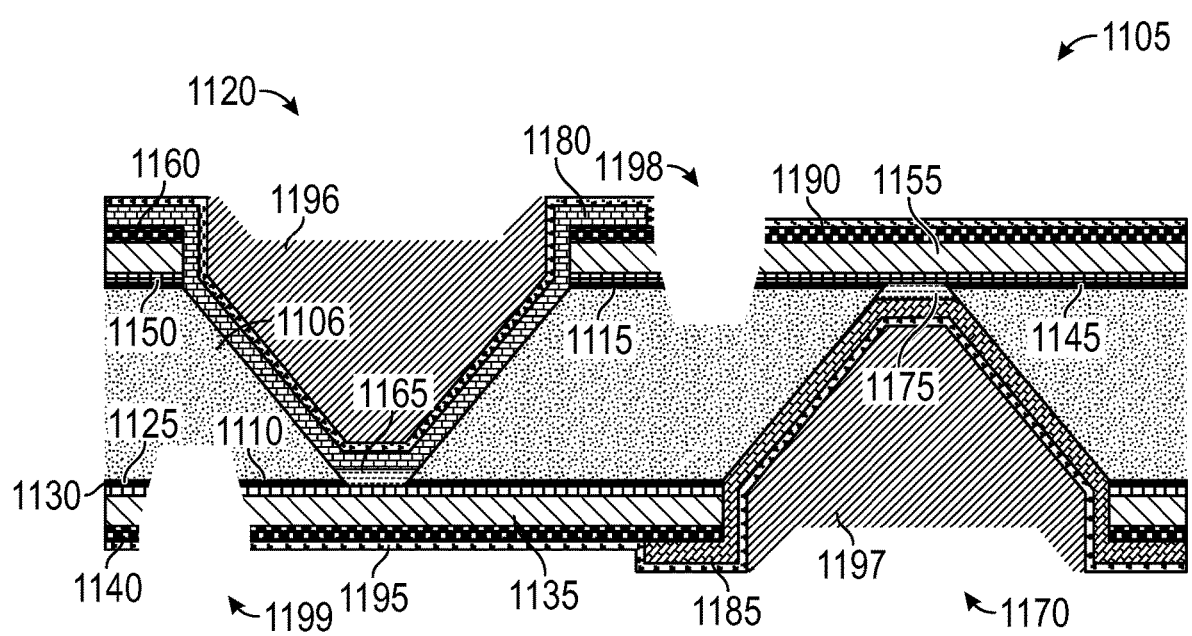
FIG. 11F is a diagram of the thermoelectric device of FIG. 11E with notches cut to direct flow of electrical current according to one embodiment of the present disclosure.

FIG. 11F shows a diagram of a thermoelectric device 1105, which includes the thermoelectric device 1104 after notches 1198, 1199 have been cut to direct electric current flow according to one embodiment of the present disclosure. In some embodiments, the first notch 1198 may be cut at or near the edge of the uncovered portion 1161 proximate to the opening of the tunnel 1120. The first notch 1198 penetrates the metal layer 1190, the n-type thermoelectric layer 1180, the second gold layer 1160, the nickel layer 1155, the first gold layer 1150, the optional adhesion layer 1145, and through the second surface 1115 and partially into the substrate 1106 to electrically isolate the electrical current flow through the layers 1190, 1180, 1160, 1155, 1150, 1145. In some embodiments, the second notch 1199 may be cut at or near the edge of the uncovered portion 1141 proximate to the opening of the tunnel 1170. The second notch 1199 penetrates the metal layer 1195, the p-type thermoelectric layer 1185, the second gold layer 1140, the nickel layer 1135, the first gold layer 1130, the optional adhesion layer 1125, and through the first surface 1110 and partially into the substrate 1106 to electrically isolate the electrically current flow through the layers 1195, 1185, 1140, 1135, 1130, 1125.

Figure 12:
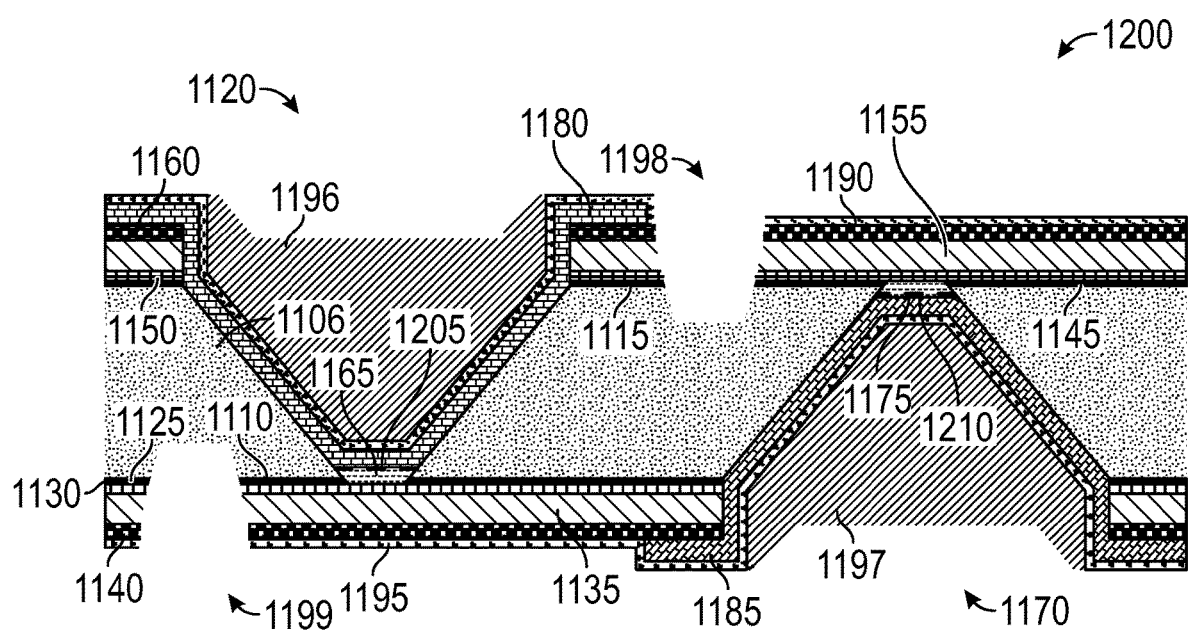
FIG. 12 is a diagram of another thermoelectric device with an energy filter layer according to another embodiment of the present disclosure.

FIG. 12 shows a diagram of a thermoelement 1200 according to another embodiment of the present disclosure. The thermoelement 1100 has all the components of the thermoelement 1105 and includes a first energy filter layer 1205 disposed between the thermoelectric layer 1180 and the barrier layer 1165 and a second energy filter layer 1210 disposed between the thermoelectric layer 1185 and the barrier layer 1175. The energy filter layers 1205, 1210 may be only a single layer or few layers of atoms in thickness. The energy filter layer 1205, 1210 may be configured to block the movement of low energy electrons or holes. The energy filter layers 1205, 1210 are selected to increase the Seebeck coefficient of the thermoelement 1200. In some embodiments, the energy filter layers 1205, 1210 may be made of two-dimensional electron gas (2DEG) structures, twisted layers of graphene, layers of hexagonal boron nitride (HBN) and graphene, silicene, phosphene, or SiTe.

In operation, the temperatures of electrons and phonons depend on the intensity of electron-phonon interactions within the thermoelectric layers 1180, 1185. The thermal conductivity of the thermoelectric devices 1105, 1200 are dependent on the ratio of the thickness t of the composite thermoelectric layers 876 to the thermalization length $\Lambda$, and the electron/phonon thermal conductivities, $\lambda_e$ and $\lambda_p$ respectively:

$$\lambda = \frac{\lambda_e(\lambda_e + \lambda_p)}{\lambda_e + \lambda_e[\tanh(t/\Lambda)/(t/\Lambda)]}.$$

Note that $\lambda \to \lambda_e$ for $t << \Lambda$ as described earlier.

Figure 13:
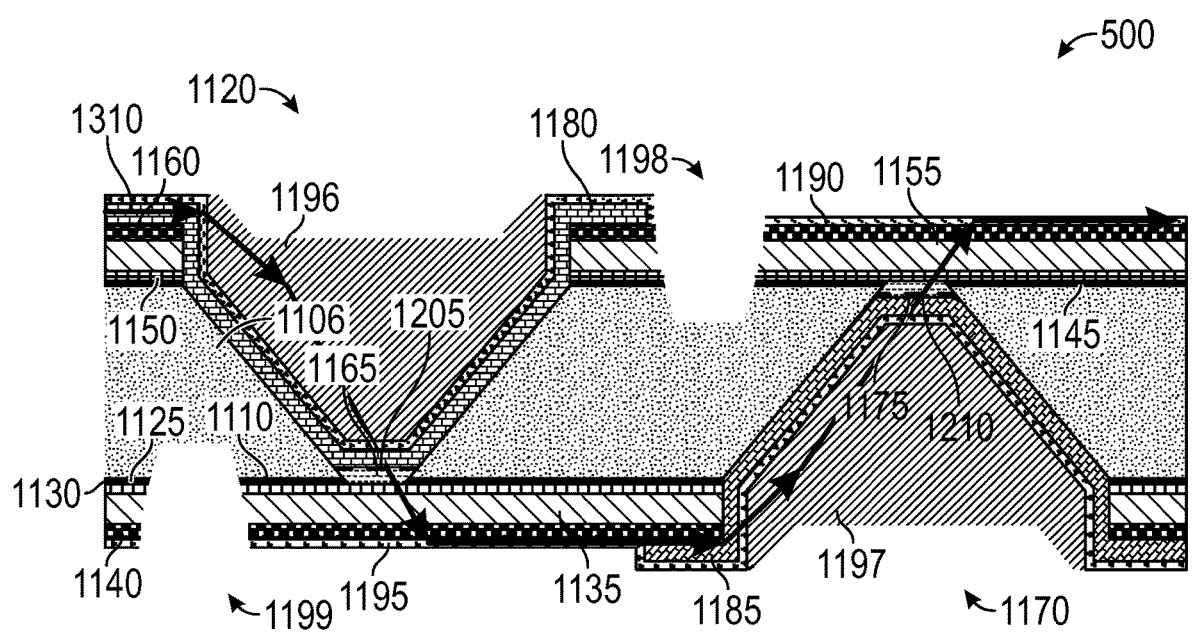
FIG. 13 is a diagram of the thermoelectric device of FIG. 12 showing the flow of electrical current through the device.

FIG. 13 shows the thermoelectric device 500 with arrows 1310 indicating the path of electric current through it.

Figure 14:
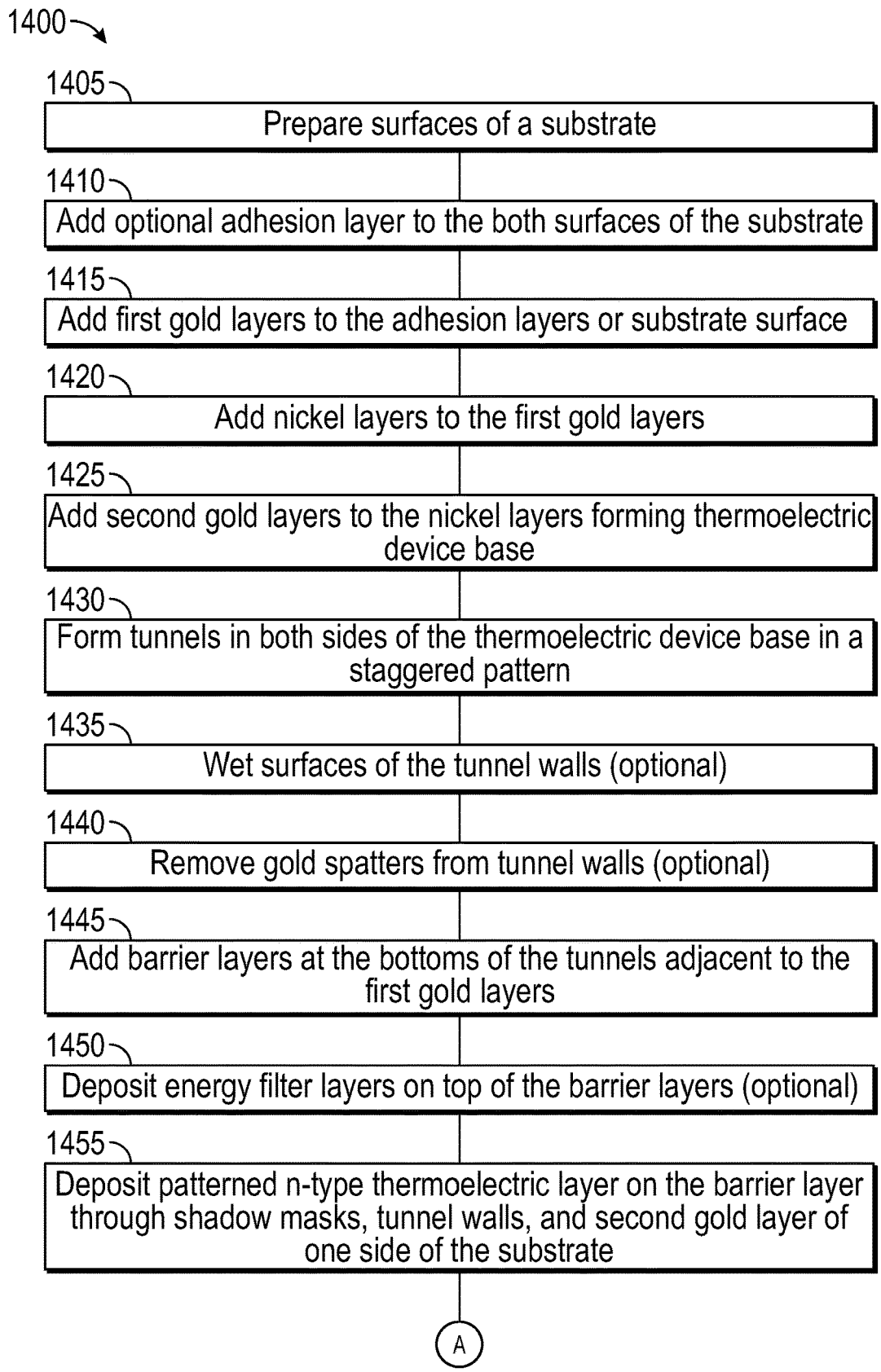
FIG. 14 is a flow chart of a method for forming a thermoelectric device according to another embodiment of the present disclosure.
Figure 14:
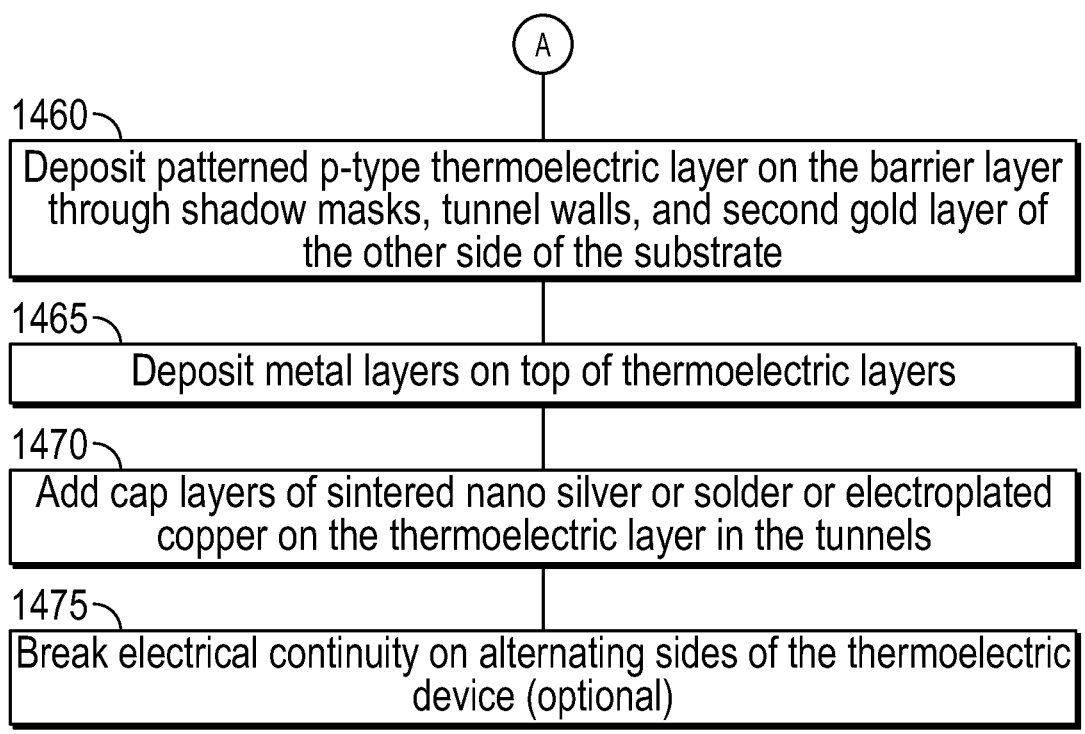

FIG. 14 shows a flow chart of a method 1400 for making a thermoelectric device 1100, 1200. In step 1405, the substrate 1106 is prepared. The preparation may include washing the surfaces of the substrate 1106 with an aqueous solution of potassium hydroxide or sodium hydroxide. The substrate 1106 may be heated to 45 degrees Celsius before or during the cleaning. In some embodiments, the substrate 1106 may be further cleaned with deionized water. The substrate 1106 may be then heated to about 150 degrees Celsius for about 2 hours to drive residual moisture out of the substrate 1106.

In step 1410, the optional adhesion layers 1125, 1145 may be added to the surfaces 1110, 1115 of the substrate 1106. The adhesion layers 1125, 1145 may be applied to a thickness of about 10 nanometers. The adhesion layers 1125, 1145 may be added using physical vapor deposition (PVD) such as sputtering or thermal evaporation. In step 1415, the first gold layers 1130, 1150 may be deposited on the adhesion layers 1125, 1145 or directly to the surfaces 1110, 1115 of the substrate 1106 if the adhesion layer 1125, 1145 is not present. The first gold layers 1130, 1150 may be applied through PVD or other suitable technique known to a person of skill in the art. The first gold layers 1130, 1150 may be applied to a thickness of about 400 nanometers. In step 1420, the nickel layers 1135, 1155 may be deposited on the first gold layers 1130, 1150. The nickel layers 1135, 1155 may be applied through electroplating or other suitable technique known to a person of skill in the art. The nickel layers 1135, 1155 may be applied to a thickness of about 5 micrometers. In step 1425, the second gold layers 1140, 1160 may be deposited on the nickel layers 1135, 1155. The second gold layers 1140, 1160 may be applied through electroplating or other suitable technique known to a person of skill in the art. The second gold layers 1140, 1160 may be applied to a thickness of about 1 micrometer. While steps 1410-1425 are shown with both surfaces 1110, 1115 being layered in the same step, it is also contemplated that steps 1410-1425 may be performed on one of the surfaces 1110, 1115 and, after completion, the steps 1410-1425 may be repeated for the other surface 1115, 1110. It is also contemplated that the steps 1410-1425 may each be performed on one side and then the other or simultaneously on both sides.

In step 1430, the tunnels 1120, 1170 may be formed by removing portions of the layers 1125, 1130, 1135, 1140, 1145 and substrate 1106 and by removing portions of the layers 1160, 1155, 1150, 1145, 1125 and the substrate 1106 as shown. The tunnels 1120, 1170 may be cylindrical, frustum, or irregular in shape. The tunnels 1120 and the tunnel 1170 may be alternate along the substrate 1106. The removal process may include laser ablation. In some instances, some of the first gold layers 1130, 1150 may be ablated as well. If some of the first gold layers 1130, 1150 is ablated, this may result in spatters (similar to spatter 845) on the walls of the tunnel 1120. In step 1435, the walls of the tunnels 1120, 1170 may be treated to make them hydrophilic. The wetting process may include using carbon tetrafluoride and oxygen plasma to create a thin layer of oxide on top of the substrate 1106 in the inner surface of the tunnels 1120, 1170 within the substrate 1106. In step 1440, the spatters 845 may be removed using micro etching. In some embodiments, the micro etching is performed by applying potassium iodide to clean the walls of the tunnels 1120, 1170.

In step 1445, the barrier layers 1165, 1175 may be deposited at the bottom of the tunnels 1120, 1170 and adjacent to the first gold layers 1130, 1150. The barrier layers 1165, 1175 may be applied using electroplating or using physical vapor deposition (PVD) such as sputtering or thermal evaporation. The barrier layers 1165, 1175 may be applied to a thickness of about 5 micrometers. The material applied to form the barrier layers 1165, 1175 may include one or more of: rhodium, platinum, iridium, tantalum/tantalum nitride, titanium/titanium nitride, chromium, or cobalt. In step 1450, the optional energy filter layers 1205, 1210 may be deposited on the barrier layers 1165, 1175. The energy filter layers 1205, 1210 may only be a few atoms thick. The energy filter layer 1205, 1210 may be made of two-dimensional electron gas (2DEG) structures, twisted layers of graphene, layers of hexagonal boron nitride (HBN) and graphene, silicene, phosphene, or SiTe.

In step 1455, the thermoelectric layer 1180 may be deposited on the barrier layer 1165 (or optional energy filter layer 1205), the exposed substrate 1106 surfaces in the tunnel 1120 and on the second gold layer 1160. The thermoelectric layer 1180 may be deposited as one uniform layer or as a plurality of alternating layers made up of composite thermoelectric layers and interlayers, similar to or the same as the composite thermoelectric layers 876 and interlayers 877. The thermoelectric layer 1180 or its sublayers (not shown) may be deposited using physical vapor deposition (PVD) such as sputtering or thermal evaporation or chemical vapor deposition (CVD) or Atomic Layer Deposition (ALD) or electroplating. The deposition of the thermoelectric layer 1180, either as homogenous layers or as sublayers, may include masking or patterning to prevent deposition on some parts of the second gold layers 1160, thus forming uncovered portions 1161. In some embodiments, the thermoelectric material in the thermoelectric layer 1180 may be n-type.

In step 1460, the thermoelectric layer 1185 may be deposited on the barrier layer 1175 (or optional energy filter layer 1210), the exposed substrate 1106 surfaces in the tunnel 1170 and on the second gold layer 1140. The thermoelectric layer 1185 may be deposited, just as the thermoelectric layer 1180, as one uniform layer or as a plurality of alternating layers made up of composite thermoelectric layers and interlayers, similar to or the same as the composite thermoelectric layers 876 and interlayers 877. The thermoelectric layer 1185 or its sublayers (not shown) may be deposited using physical vapor deposition (PVD) such as sputtering or thermal evaporation or chemical vapor deposition (CVD) or Atomic Layer Deposition (ALD) or electroplating. The deposition of the thermoelectric layer 1185, either as homogenous layers or as sublayers, may include masking or patterning to prevent deposition on some parts of the second gold layers 1140, thus forming uncovered portions 1141. In some embodiments, the thermoelectric material in the thermoelectric layer 1180 may be p-type.

In step 1465, the metal layer 1190 may be deposited on the thermoelectric layer 1180 and the metal layer 1195 may be deposited on the thermoelectric layer 1185. The metal layers 1190, 1195 may be deposited as one uniform layer or as a plurality of layers, such as the layers 881, 882, 883. The metal layers 1190, 1195 may be deposited using physical vapor deposition (PVD) such as sputtering or thermal evaporation or electroplating. Where the metal layers 1190, 1195 have as the first layer 881, the second layer 882, and the third layer 883, then these layers may be deposited as described in step 360. In some embodiments, the metal layers 1190, 1195 may contain more or fewer than three sublayers.

In step 1470, the cap layer 1196 may be deposited in the tunnel 1120 adjacent to the metal layer 1190, and the cap layer 1197 may be deposited in the tunnel 1170 adjacent to the metal layer 1195. The cap layers 1196, 1197 may partially or fully fill in their tunnels 1120, 1170 and be flush with the surfaces 1110, 1115 or even fill to be flush with the metal layers 1190, 1195. The cap layers 1190, 1195 may be composed of sintered nano-silver or solder, such as one or more of: BiSn, SnAgCu, and AuSn or electroplated metals like copper, nickel, platinum, gold, or silver.

In some embodiments, electrical continuity on each side by be broken-isolating parts of each side to emphasize the flow of current between the sides. In step 1475, creating a first notch 1198. The first notch 1198 may be inside or outside of the uncovered portion 1161, such that it breaks electrical continuity in the metal layer 1190, the thermoelectric layer 1180 (when present), the second gold layer 1160, the nickel layer 1155, the first gold layer 1150, and the adhesion layer 1145. The first notch 1198 may also extend into the substrate 1106. Similarly, a second notch 1199 may be created. The second notch 1199 may be inside or outside of the uncovered portion 1141, such that the second notch 1199 breaks electrical continuity in the metal layer 1195, the thermoelectric layer 1185 (when present), the second gold layer 1140, the nickel layer 1135, the first gold layer 1130, and the adhesion layer 1125 to break electrical continuity. The second notch 1199 may also extend into the substrate 1106.

Figure 15A:
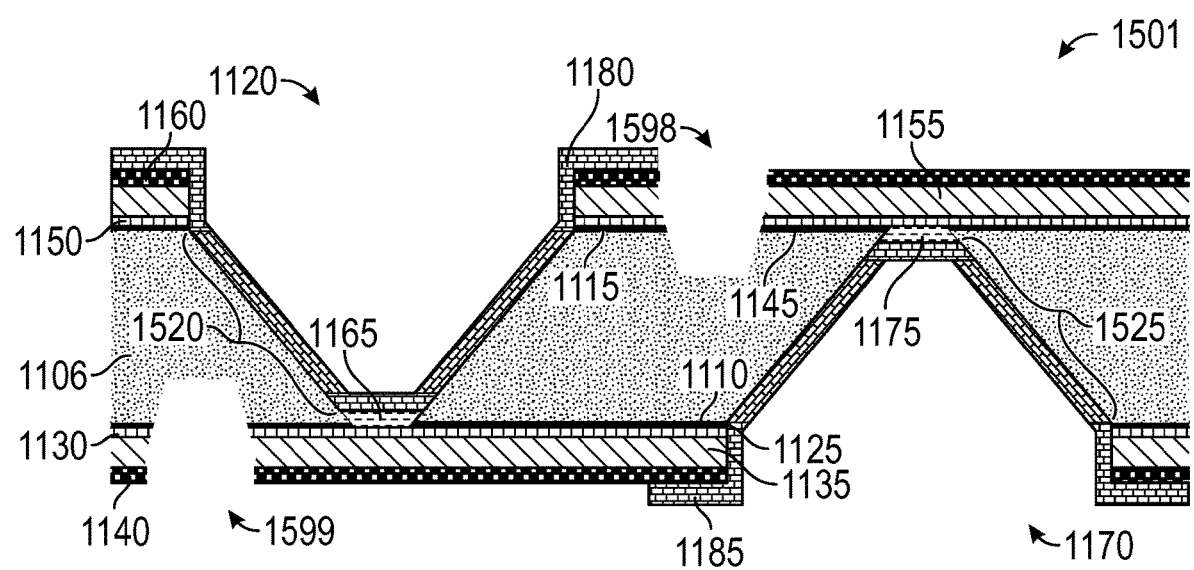
FIG. 15A is a diagram of the thermoelectric device of FIG. 11C with electrical isolation notches according to one embodiment of the present disclosure.

FIG. 15A shows a diagram of a thermoelectric device 1501, which is a variation on the thermoelectric device 1102 but with notches 1598, 1599 to direct electric current flow. The first notch 1598 penetrates the n-type thermoelectric layer 1180 (when present), the second gold layer 1160, the nickel layer 1155, the first gold layer 1150, the optional adhesion layer 1145, and through the second surface 1115 and partially into the substrate 1106 to electrically isolate the electrical current flow through the layers 1180, 1160, 1155, 1150, 1145. The second notch 1599 penetrates the p-type thermoelectric layer 1185 (when present), the second gold layer 1140, the nickel layer 1135, the first gold layer 1130, the optional adhesion layer 1125, and through the first surface 1110 and partially into the substrate 1106 to electrically isolate the electrically current flow through the layers 1185, 1140, 1135, 1130, 1125. The thermoelectric device 1501 may be fashioned by performing the method 1400 without the steps 1465 and 1470. In operation, the flow of heat between the hot and cold sides of the device 1501 will form temperature differential bands 1520, 1525 that run through the thermoelectric layers 1180, 1185 along the walls of the tunnels 1120, 1170.

Figure 15B:
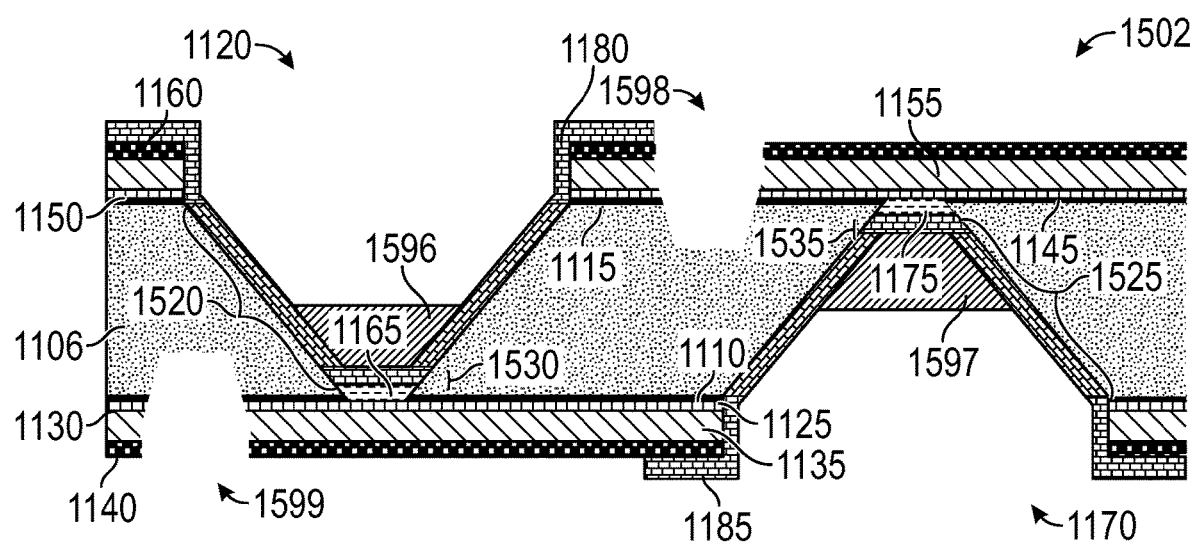
FIG. 15B is a diagram of the thermoelectric device of FIG. 15A with the tunnels partially filled with cap material according to one embodiment of the present disclosure.

FIG. 15B shows a diagram of the thermoelectric device 1501 where the tunnels 1120, 1170 have been partially filled by cap layers 1596, 1597 to form thermoelectric device 1502. The cap layers 1596, 1597 may be made of the same materials as the cap layers 1196, 1197. In other words, step 1465 has been performed to partially fill the tunnels 1120, 1170. In operation, the flow of heat between the hot and cold sides of the device 1502 forms the temperature differential bands 1520, 1525 and also partially bypasses the thermoelectric layers 1180, 1185 in the walls of the tunnels 1120, 1170 has heat flows through the cap layers 1596, 1597 to form temperature differential bands 1530, 1535. Temperature differential bands 1530, 1535 are significantly thinner than the temperature differential bands 1520, 1525. In some embodiments, the temperature differential bands 1530, 1535 are about 70 micrometers, while the temperature differential bands 1520, 1525 are about 2-5 micrometers in thickness. In some embodiments, the cap layers 1596, 1597 are optional.

Figure 15C:
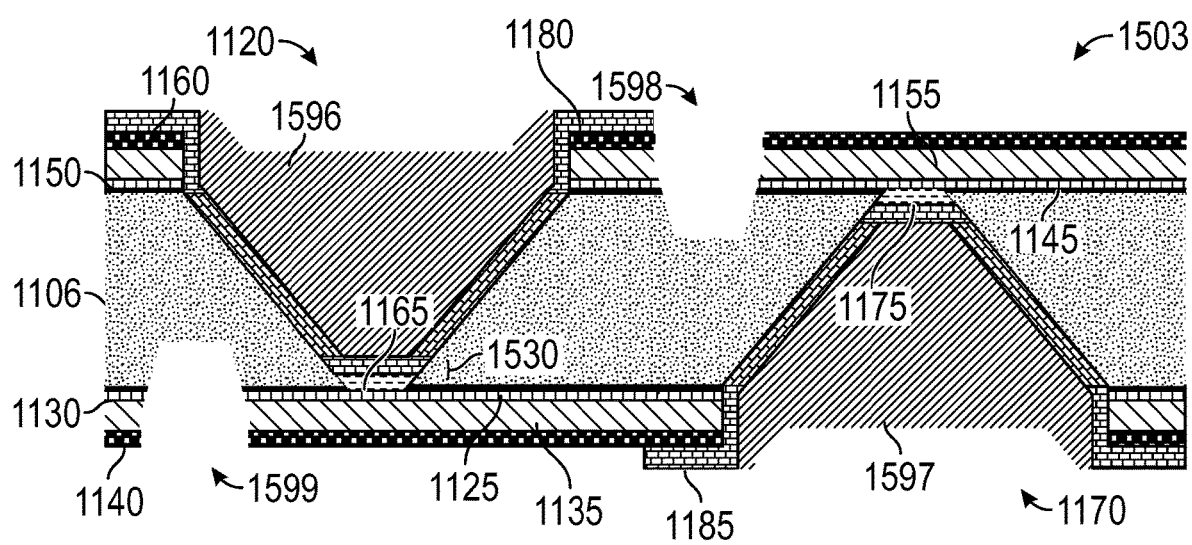
FIG. 15C is a diagram of the thermoelectric deice of FIG. 15B with the tunnels filled up to the outside of the thermoelectric layers according to one embodiment of the present disclosure.

FIG. 15C shows a diagram of the thermoelectric device 1502 where the tunnels 1120, 1170 have been filled with cap layers 1596, 1597 to form the thermoelectric device 1503. Since the cap layers 1596, 1597 are in contact with the thermoelectric materials 1180, 1185 in the walls of the tunnels 1120, 1170, the heat flow is largely through the cap layers 1596, 1597, which dominates the heat flow through the thermoelectric layers 1180, 1185 in the walls, during operations.

Figure 16A:
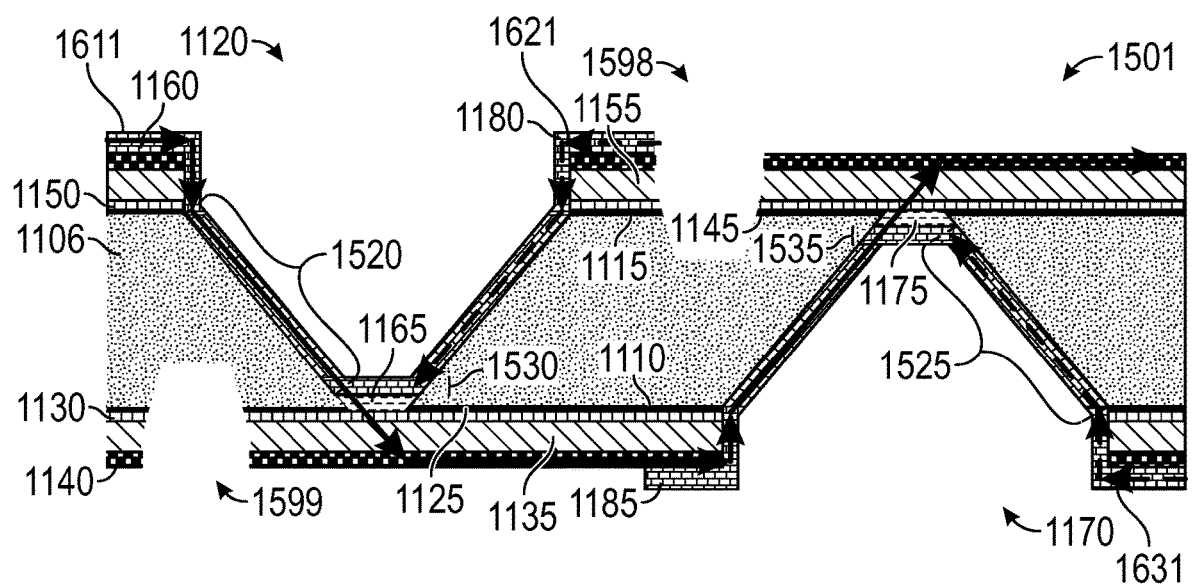
FIG. 16A is a diagram of the thermoelectric device of FIG. 15A showing heat flow through the device.
Figure 16B:
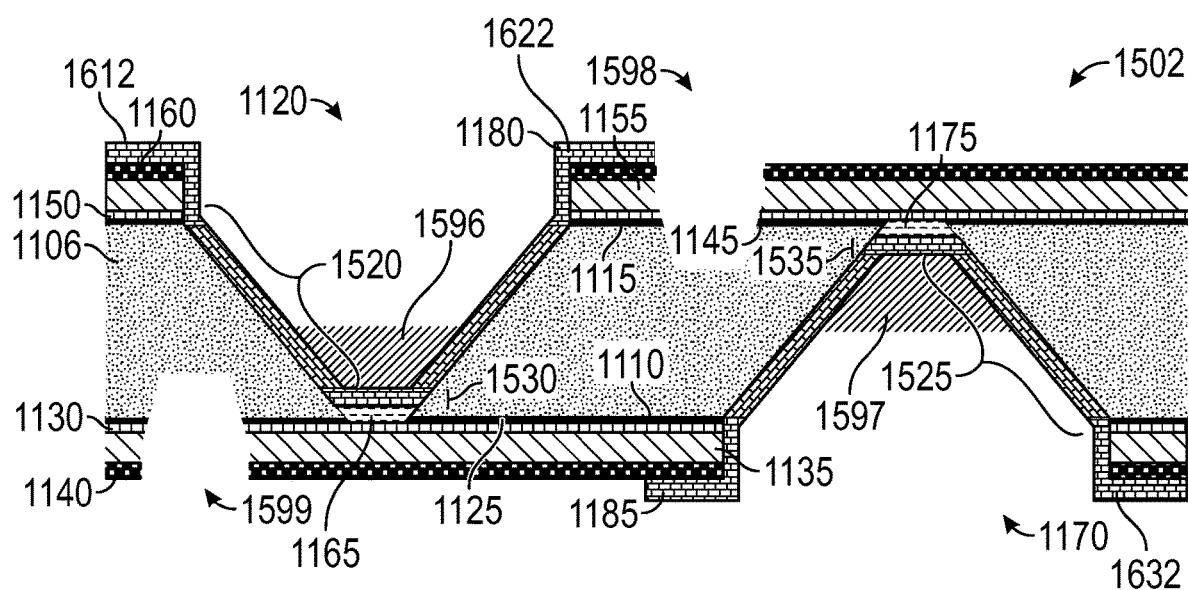
FIG. 16B is a diagram of the thermoelectric device of FIG. 15B showing heat flow through the device.
Figure 16C:
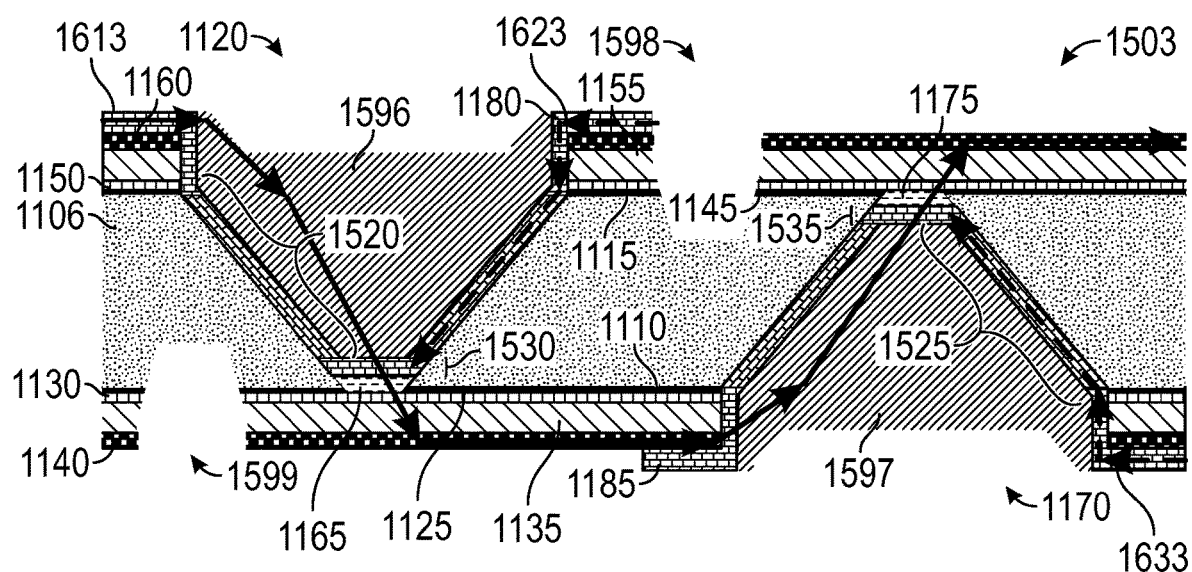
FIG. 16C is a diagram of the thermoelectric device of FIG. 15C showing heat flow through the device.

FIGS. 16A-16C show diagrams of the thermoelectric devices 1501, 1502, 1503 with heat flows. FIG. 16A shows heat paths 1611, 1621, 1631 that follow the thermoelectric layers 1180, 1185 along the walls of the tunnels 1120, 1170. FIG. 16B shows heat paths 1612, 1622, 1632 that follow the thermoelectric layers 1180, 1185 in the walls of the tunnel 1120, 1170 until the cap layers 1596, 1597 provide an alternate, and lower resistance path. The paths 1612, 1622, 1632 are shown curving to indicate that both the temperature differential bands 1520, 1525 and the temperature differential bands 1530, 1535 are impacting the performance of the thermoelectric device 1502. FIG. 16C shows heat paths 1613, 1623, 1633 mostly through the cap layers 1596, 1597 as the cap layers 1596, 1597 provide a lower resistance path.

As can be seen in FIGS. 15A-15C and 16A-16C, the heat paths 1611, 1612, 1613, 1621, 1622, 1623, 1631, 1632, 1633 can be selected by adjusting the amounts of cap layers 1596, 1597 present in the tunnels 1120, 1170 between none (FIGS. 15A, 16A) and full (FIGS. 15C, 16C). Thus, performance of the thermoelectric device can be varied by adjusting the cap layers 1596, 1597.

In one embodiment, the thermoelectric device 1501 has a larger temperature differential (about 100 to about 140 degrees Celsius) and low power (about 0.1 watts to about 1 watts). The bias current flow in thermoelectric device 1501 may be about 10 to about 50 mA, which is suitable for cooling photodetectors, sensors, charge-couple devices (CCDs), cameras, and other low power devices. The cooling density is about 0.1-1 Watts per square centimeter. In power generation mode, the thermal conductance of thermoelectric device 1501 can be easily matched to the low thermal conductance of the heat sinks based on natural convection and radiation.

On the other extreme, in one embodiment, the thermoelectric device 1503 has lower thermal impedance a smaller temperature differential (about 30 to about 40 degrees Celsius), and high power (about 100 watts). The current flow in the thermoelectric device 1503 may be about 1 to about 5 amperes, which is suitable for cooling systems. The cooling density is about 20 watts per square centimeter The thermoelectric device 1502 can be tailored to performance between that of the thermoelectric device 1501 and the thermoelectric device 1503 by adjusting the amount of cap layer 1596, 1597 added during step 1470.

Figure 17:
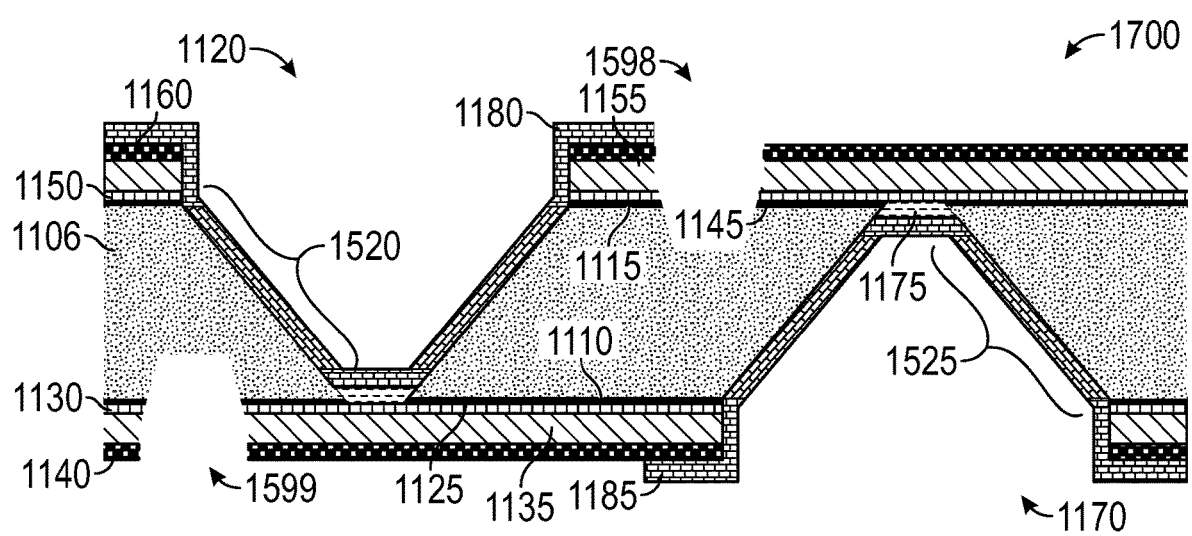
FIG. 17 is a diagram of the thermoelectric device of FIG. 15A without barrier layers according to one embodiment of the present disclosure.

FIG. 17 shows a diagram of a thermoelectric device 1700 that is based on the thermoelectric device 1501 but without the barrier layers 1165, 1175. Since the barrier layers 1165, 1175 are not present, the thermoelectric layers 1180, 1185 may be disposed in the tunnels 1120, 1170 and be in contact with the first gold layers 1125, 1150. In some embodiments, the interlayers within the thermoelectric layers 1180, 1185 may be replaced by an energy filtering layer of graphene or other 2DEG material.

Figure 18:
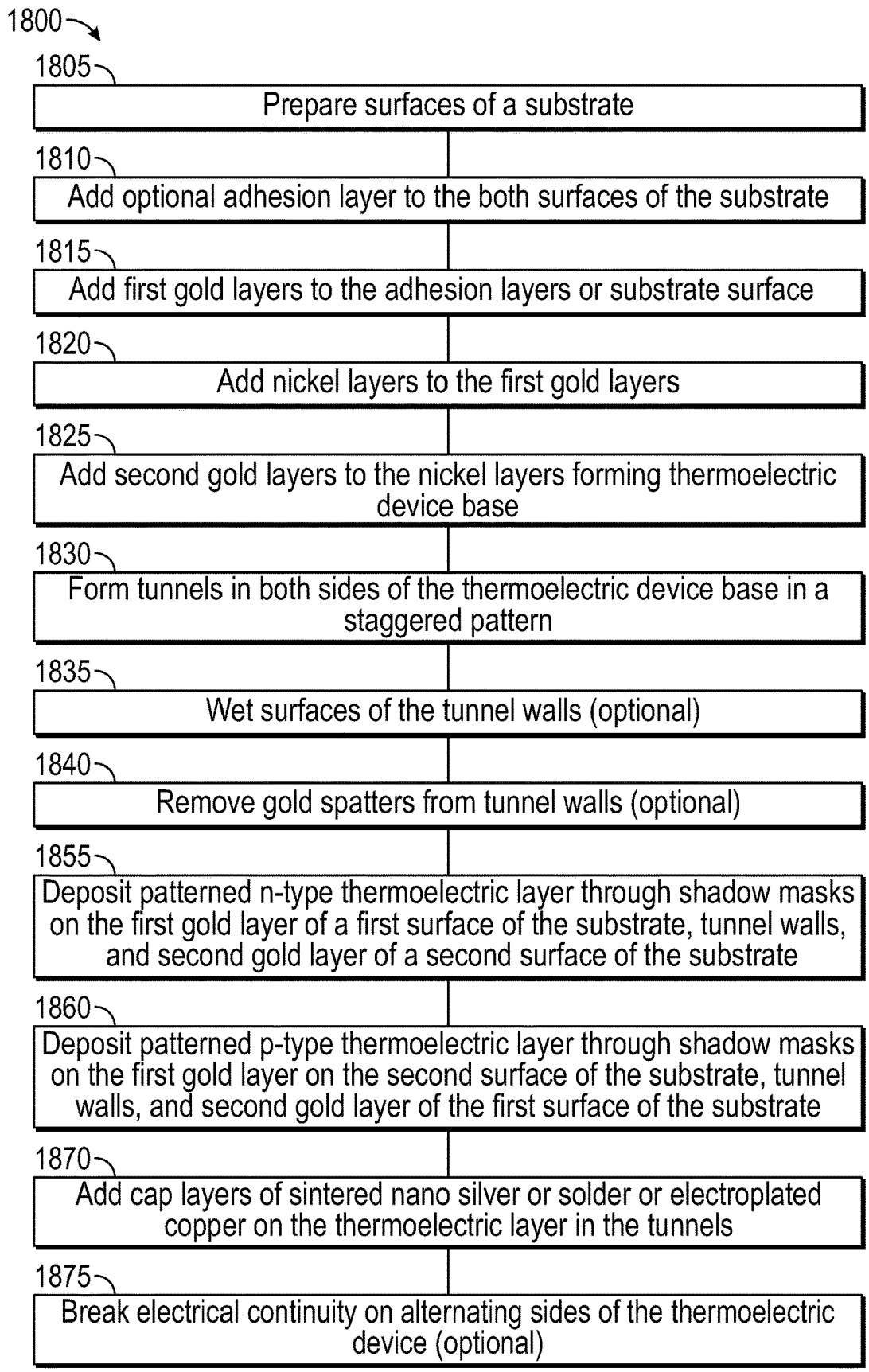
FIG. 18 is a flow chart of a method for forming a thermoelectric device according to another embodiment of the present disclosure.

FIG. 18 shows a flow chart of a method 1800 for making a thermoelectric device 1700. In step 1805, the substrate 1106 is prepared. The preparation may include washing the surfaces of the substrate 1106 with an aqueous solution of potassium hydroxide or sodium hydroxide. The substrate 1106 may be heated to 45 degrees Celsius before or during the cleaning. In some embodiments, the substrate 1106 may be further cleaned with deionized water. The substrate 1106 may be then heated to about 150 degrees Celsius for about 2 hours to drive residual moisture out of the substrate 1106.

In step 1810, the optional adhesion layers 1125, 1145 may be added to the surfaces 1110, 1115 of the substrate 1106. The adhesion layers 1125, 1145 may be applied to a thickness of about 10 nanometers. The adhesion layers 1125, 1145 may be added using physical vapor deposition (PVD) such as sputtering or thermal evaporation. In step 1815, the first gold layers 1130, 1150 may be deposited on the adhesion layers 1125, 1145 or directly to the surfaces 1110, 1115 of the substrate 1106 if the adhesion layer 1125, 1145 is not present. The first gold layers 1130, 1150 may be applied through PVD or other suitable technique known to a person of skill in the art. The first gold layers 1130, 1150 may be applied to a thickness of about 400 nanometers. In step 1820, the nickel layers 1135, 1155 may be deposited on the first gold layers 1130, 1150. The nickel layers 1135, 1155 may be applied through electroplating or other suitable technique known to a person of skill in the art. The nickel layers 1135, 1155 may be applied to a thickness of about 5 micrometers. In step 1825, the second gold layers 1140, 1160 may be deposited on the nickel layers 1135, 1155. The second gold layers 1140, 1160 may be applied through electroplating or other suitable technique known to a person of skill in the art. The second gold layers 1140, 1160 may be applied to a thickness of about 1 micrometer. While steps 1810-1825 are shown with both surfaces 1110, 1115 being layered in the same step, it is also contemplated that steps 1810-1825 may be performed on one of the surfaces 1110, 1115 and, after completion, the steps 1810-1825 may be repeated for the other surface 1115, 1110. It is also contemplated that the steps 1810-1825 may each be performed on one side and then the other or simultaneously on both sides.

In step 1830, the tunnels 1120, 1170 may be formed by removing portions of the layers 1125, 1130, 1135, 1140, 1145 and substrate 1106 and by removing portions of the layers 1160, 1155, 1150, 1145, 1125 and the substrate 1106 as shown. The tunnels 1120, 1170 may be cylindrical, frustum, or irregular in shape. The tunnels 1120 and the tunnel 1170 may be alternate along the substrate 1106. The removal process may include laser ablation. In some instances, some of the first gold layers 1130, 1150 may be ablated as well. If some of the first gold layers 1130, 1150 is ablated, this may result in spatters (similar to spatter 845) on the walls of the tunnel 1120. In step 1835, the walls of the tunnels 1120, 1170 may be treated to make them hydrophilic. The wetting process may include using carbon tetrafluoride and oxygen plasma to create a thin layer of oxide on top of the substrate 1106 in the inner surface of the tunnels 1120, 1170 within the substrate 1106. In step 1840, the spatters 845 may be removed using micro etching. In some embodiments, the micro etching is performed by applying potassium iodide to clean the walls of the tunnels 1120, 1170.

In step 1855, the thermoelectric layer 1180 may be deposited on the first gold layer 1130, the exposed substrate 1106 surfaces in the tunnel 1120 and on the second gold layer 1160. The thermoelectric layer 1180 may be deposited as one uniform layer or as a plurality of alternating layers made up of composite thermoelectric layers and interlayers, similar to or the same as the composite thermoelectric layers 876 and interlayers 877. The thermoelectric layer 1180 or its sublayers (not shown) may be deposited using physical vapor deposition (PVD) such as sputtering or thermal evaporation or chemical vapor deposition (CVD) or Atomic Layer Deposition (ALD) or electroplating. The deposition of the thermoelectric layer 1180, either as homogenous layers or as sublayers, may include masking or patterning to prevent deposition on some parts of the second gold layers 1160, thus forming uncovered portions 1161. In some embodiments, the thermoelectric material in the thermoelectric layer 1180 may be n-type.

In step 1860, the thermoelectric layer 1185 may be deposited on the first gold layer 1150, the exposed substrate 1106 surfaces in the tunnel 1170 and on the second gold layer 1140. The thermoelectric layer 1185 may be deposited, just as the thermoelectric layer 1180, as one uniform layer or as a plurality of alternating layers made up of composite thermoelectric layers and interlayers, similar to or the same as the composite thermoelectric layers 876 and interlayers 877. The thermoelectric layer 1185 or its sublayers (not shown) may be deposited using physical vapor deposition (PVD) such as sputtering or thermal evaporation or chemical vapor deposition (CVD) or Atomic Layer Deposition (ALD) or electroplating. The deposition of the thermoelectric layer 1185, either as homogenous layers or as sublayers, may include masking or patterning to prevent deposition on some parts of the second gold layers 1140, thus forming uncovered portions 1141. In some embodiments, the thermoelectric material in the thermoelectric layer 1185 may be p-type.

In step 1870, the optional cap layer 1596 may be deposited in the tunnel 1120 adjacent to the thermoelectric layer 1180, and optional the cap layer 1597 may be deposited in the tunnel 1170 adjacent to the thermoelectric layer 1195. The cap layers 1596, 1597 may partially or fully fill in their tunnels 1120, 1170 and be flush with the surfaces 1110. The cap layers 1596, 1597 may be composed of sintered nano-silver or solder, such as one or more of: BiSn, SnAgCu, and AuSn or electroplated metals like copper, nickel, platinum, gold, or silver.

In some embodiments, electrical continuity on each side by be broken-isolating parts of each side to emphasize the flow of current between the sides. In step 1875, creating a first notch 1198 in the thermoelectric layer 1180, the second gold layer 1160, the nickel layer 1155, the first gold layer 1150, and the adhesion layer 1145 to break electrical continuity. The first notch 1198 may also extend into the substrate 1106. A second notch 1199 may be created in the thermoelectric layer 1185, the second gold layer 1140, the nickel layer 1135, the first gold layer 1130, and the adhesion layer 1125 to break electrical continuity. The second notch 1199 may also extend into the substrate 1106.

While the disclosure has been described with reference to exemplary embodiments, it will be understood that various changes may be made, and equivalents may be substituted for elements thereof, without departing from the scope of the disclosure. In addition, many modifications will be appreciated to adapt a particular instrument, situation, or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

What is claimed is:

1. A thermoelectric apparatus, the apparatus comprising:
  a thermoelement base comprising:
    a thermally and electrically non-conductive substrate having a first surface and a second surface;
    a tunnel between the first surface and the second surface, where the tunnel has a first opening in the first surface and a second opening in the second surface;
    a first gold layer proximate to the second surface;
    a nickel layer adjacent to the first gold layer; and
    a second gold layer adjacent to the nickel layer;
  a barrier layer disposed within the tunnel proximate to the first surface;
  a thermoelectric layer disposed within the tunnel adjacent to the barrier layer, wherein the thermoelectric layer conforms to a shape of the barrier layer, the tunnel, and the second surface;
  a metal layer disposed within the tunnel adjacent to the thermoelectric layer, wherein the thermoelectric layer conforms to the shape of the barrier layer, the tunnel, and the second surface; and
  a cap layer disposed within the tunnel adjacent to the metal layer and proximate to the second surface.

2. The apparatus of claim 1, wherein the thermally and electrically non-conductive substrate is made of one of: a polyimide, a liquid crystal polymer (LCP), parylene, PTFE, polymer aerogels, and a glass.

3. The apparatus of claim 1, wherein the thermally and electrically non-conductive substrate is between about 10 micrometers to about 1000 micrometers thick; the first gold layer is about 400 nanometers thick; the nickel layer is about 5 micrometers thick; and the second gold layer is about 1 micrometer thick.

4. The apparatus of claim 1, wherein the thermoelectric layer is made of a thermoelectric material comprising one of:
  an n-type thermoelectric material; and
  a p-type thermoelectric material.

5. The apparatus of claim 4, wherein
  the n-type thermoelectric material is made of one or more of: Bi—Te—Se, SiGe—P, $Mg_3Bi_2$, Mg—Sb—B—Te, InSb, BiSb, PbSe, SnSSe, Half-Heusler alloys, full Heusler alloys, Fe—V—W—Al, Yb—Ba—Co—Sb, La—Te, Pr—Te, SiGe—C, and YbAl; and
  the p-type thermoelectric material is made of one or more of: BiSb—Te, SiGe—B, Zintl compounds, Yb—Mn—Sb, Ce—Fe—Co—Sb, CePd, CsBiTe, PbTe, and ZnSb.

6. The apparatus of claim 4, wherein the thermoelectric layer further comprises: at least one interlayer that alternates with the n-type thermoelectric material or the p-type thermoelectric material, the at least one interlayer comprising one of: TiW, gold, iridium, platinum, tungsten, molybdenum, and InSb.

7. The apparatus of claim 1, wherein the barrier layer is about 5 micrometers thick.

8. The apparatus of claim 1, wherein the barrier layer comprises one or more of: rhodium, platinum, iridium, tantalum and tantalum nitride, titanium and titanium nitride, chromium, and cobalt.

9. The apparatus of claim 1, wherein the metal layer is made of platinum.

10. The apparatus of claim 1, wherein the metal layer comprises:
  a first sublayer made of one of: platinum, nickel, TiW, Ta—TaN, titanium, cobalt, iridium, and rhodium;
  a second sublayer made of one of: platinum, cobalt, and nickel; and
  a third sublayer made of one of: platinum, gold, and silver;
  wherein the first sublayer is disposed adjacent to the thermoelectric layer and the second sublayer is disposed between the first sublayer and the third sublayer.

11. The apparatus of claim 1, wherein the cap layer comprises one of: sintered nano-silver and solder.

12. The apparatus of claim 1, further comprising:
  an adhesion layer disposed between the first surface of the substrate and the first gold layer.

13. The apparatus of claim 1, further comprising:
  an energy filter layer disposed between the barrier layer and the thermoelectric layer.

14. The apparatus of claim 1, wherein the energy filter layer is made of graphene.

* * * * *